US012771310B2

(12) United States Patent
Jonosono et al.

(10) Patent No.: US 12,771,310 B2
(45) Date of Patent: Oct. 20, 2026

(54) METHOD FOR MANUFACTURING ACOUSTIC WAVE ELEMENT AND ACOUSTIC WAVE ELEMENT

(71) Applicant: Murata Manufacturing Co., Ltd., Nagaokakyo (JP)

(72) Inventors: Shinya Jonosono, Nagaokakyo (JP); Takashi Yamane, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 98 days.

(21) Appl. No.: 18/769,753

(22) Filed: Jul. 11, 2024

(65) Prior Publication Data

US 2024/0372524 A1 Nov. 7, 2024

Related U.S. Application Data

(63) Continuation of application No. PCT/JP2023/001275, filed on Jan. 18, 2023.

(60) Provisional application No. 63/300,699, filed on Jan. 19, 2022.

(51) Int. Cl.
*H03H 9/02* (2006.01)

(52) U.S. Cl.
CPC .... *H03H 9/02228* (2013.01); *H03H 9/02015* (2013.01); *H03H 9/02157* (2013.01)

(58) Field of Classification Search
CPC ........... H03H 9/02228; H03H 9/02015; H03H 9/02157; H03H 9/02574; H03H 9/145; H03H 3/08; H03H 9/25; H03H 9/64
See application file for complete search history.

(56) References Cited

U.S. PATENT DOCUMENTS

| | | | | |
|---|---|---|---|---|
| 12,255,628 | B2 * | 3/2025 | Yamane | H03H 9/02102 |
| 2017/0264266 | A1 | 9/2017 | Kishimoto | |
| 2018/0033952 | A1 | 2/2018 | Yamamoto et al. | |
| 2021/0408994 | A1 | 12/2021 | Nagatomo et al. | |
| 2024/0267017 | A1 * | 8/2024 | Jonosono | H01L 21/6836 |

FOREIGN PATENT DOCUMENTS

| | | | | | |
|---|---|---|---|---|---|
| CN | 118077145 | A * | 5/2024 | | H03H 9/02574 |
| CN | 118369853 | A * | 7/2024 | | H03H 9/02015 |
| JP | 2012257019 | A | 12/2012 | | |
| JP | 2015119219 | A | 6/2015 | | |

(Continued)

OTHER PUBLICATIONS

International Search Report in PCT/JP2023/001275, mailed Apr. 11, 2023, 3 pages.

(Continued)

*Primary Examiner* — Andrea Lindgren Baltzell
*Assistant Examiner* — Kimberly E Glenn
(74) *Attorney, Agent, or Firm* — Keating & Bennett, LLP

(57) ABSTRACT

A method for manufacturing an acoustic wave element includes preparing a wafer, attaching the wafer to a dicing tape, dicing the wafer to singulate the acoustic wave element, and abutting a pin against the acoustic wave element with the dicing tape interposed therebetween to separate the acoustic wave element from the dicing tape, and pick up the acoustic wave element. A position at which the pin is abutted against the acoustic wave element overlaps a hollow portion in a support of the acoustic wave element in a lamination direction.

17 Claims, 14 Drawing Sheets

(56) References Cited

FOREIGN PATENT DOCUMENTS

| | | | |
|---|---|---|---|
| JP | 2015204531 | A | 11/2015 |
| JP | 2018019286 | A | 2/2018 |
| WO | 2016103925 | A1 | 6/2016 |

OTHER PUBLICATIONS

Written Opinion in PCT/JP2023/001275, mailed Apr. 11, 2023, 9 pages.

* cited by examiner

METHOD FOR MANUFACTURING ACOUSTIC WAVE ELEMENT AND ACOUSTIC WAVE ELEMENT

CROSS REFERENCE TO RELATED APPLICATIONS

This application claims the benefit of priority to Provisional Application No. 63/300,699 filed on Jan. 19, 2022 and is a Continuation Application of PCT Application No. PCT/JP2023/001275 filed on Jan. 18, 2023. The entire contents of each application are hereby incorporated herein by reference.

BACKGROUND OF THE INVENTION

1. Field of the Invention

The present disclosure relates to methods for manufacturing acoustic wave elements and acoustic wave elements.

2. Description of the Related Art

For example, Japanese Unexamined Patent Application Publication No. 2012-257019 discloses an acoustic wave device utilizing a plate wave. The acoustic wave device described in Japanese Unexamined Patent Application Publication No. 2012-257019 includes a support, a piezoelectric substrate, and an interdigital transducer (IDT) electrode. The support is provided with a hollow portion. The piezoelectric substrate is provided on the support to overlap the hollow portion. The IDT electrode is provided on the piezoelectric substrate to overlap the hollow portion. In the acoustic wave device, a plate wave is excited by the IDT electrode.

SUMMARY OF THE INVENTION

Example embodiments of the present invention provide methods for manufacturing acoustic wave elements and acoustic wave elements. The methods are able to reduce or prevent an occurrence of a crack.

A method for manufacturing an acoustic wave element according to an example embodiment of the present invention is a method for manufacturing an acoustic wave element including a support, a piezoelectric material layer on the support, and a functional electrode on the piezoelectric material layer, the support including a hollow portion at a position overlapping a portion of the functional electrode in a lamination direction of the support and the piezoelectric material layer, the method including preparing a wafer, attaching the wafer to a dicing tape, dicing the wafer to singulate the acoustic wave element, and abutting at least one pin against the acoustic wave element with the dicing tape interposed therebetween, to separate the acoustic wave element from the dicing tape and pick up the acoustic wave element, in which a position at which the at least one pin is abutted against the acoustic wave element overlaps the hollow portion in the lamination direction.

An acoustic wave element according to an example embodiment of the present invention includes a support, a piezoelectric material layer on the support, and a functional electrode on the piezoelectric material layer, in which the support includes a hollow portion at a position overlapping at least a portion of the functional electrode in a lamination direction of the support and the piezoelectric material layer, a surface of the support facing the piezoelectric material layer includes at least one abutting mark defining a contact mark with a pin, and the at least one abutting mark is located at a position overlapping the hollow portion in the lamination direction.

According to example embodiments of the present invention, methods for manufacturing acoustic wave elements and acoustic wave elements are able to reduce or prevent an occurrence of a crack.

The above and other elements, features, steps, characteristics and advantages of the present invention will become more apparent from the following detailed description of the example embodiments with reference to the attached drawings.

DETAILED DESCRIPTION OF THE EXAMPLE EMBODIMENTS

Acoustic wave devices according to example embodiments of the present invention each include a piezoelectric layer including lithium niobate or lithium tantalate, and a first electrode and a second electrode facing each other in a direction intersecting a thickness direction of the piezoelectric layer.

An acoustic wave device according to an example embodiment of the present invention utilizes a bulk wave in a thickness-shear mode.

In ae acoustic wave device according to an example embodiment of the present invention, the first electrode and the second electrode are adjacent electrodes, and d/p is, for example, about 0.5 or less, where d is a thickness of the piezoelectric layer and p is a center-to-center distance between the first electrode and the second electrode. Thus, a Q value can be increased even when miniaturization is advanced.

An acoustic wave device according to an example embodiment of the present invention utilizes a Lamb wave as a plate wave. Resonance characteristics of the Lamb wave can be obtained.

An acoustic wave device according to an example embodiment of the present invention includes a piezoelectric layer including lithium niobate or lithium tantalate, and an upper electrode and a lower electrode facing each other with the piezoelectric layer interposed therebetween in the thickness direction of the piezoelectric layer, and utilizes a bulk wave.

Hereinafter, the present invention will be clarified by describing specific example embodiments of acoustic wave devices according to example embodiments of the present invention with reference to the drawings.

The example embodiments described in the present specification are merely examples, and partial replacement or combination of the configurations can be provided between the different example embodiments.

First Example Embodiment

Figure 1A:
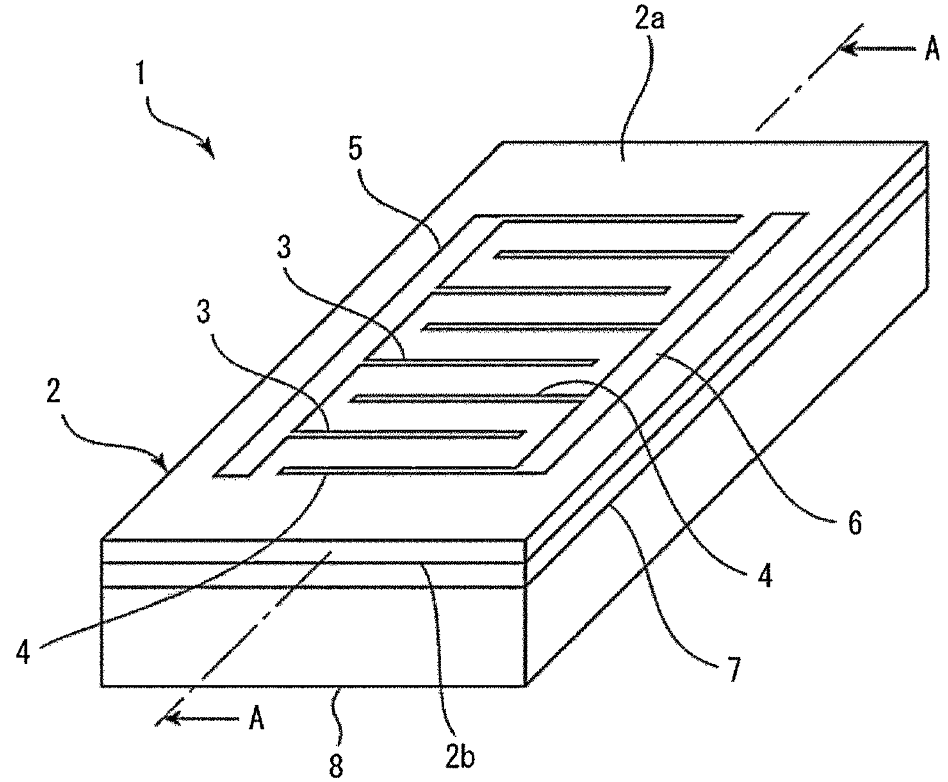
FIG. 1A is a schematic perspective view illustrating an external appearance of an acoustic wave device according to an example embodiment of the present invention.
Figure 1B:
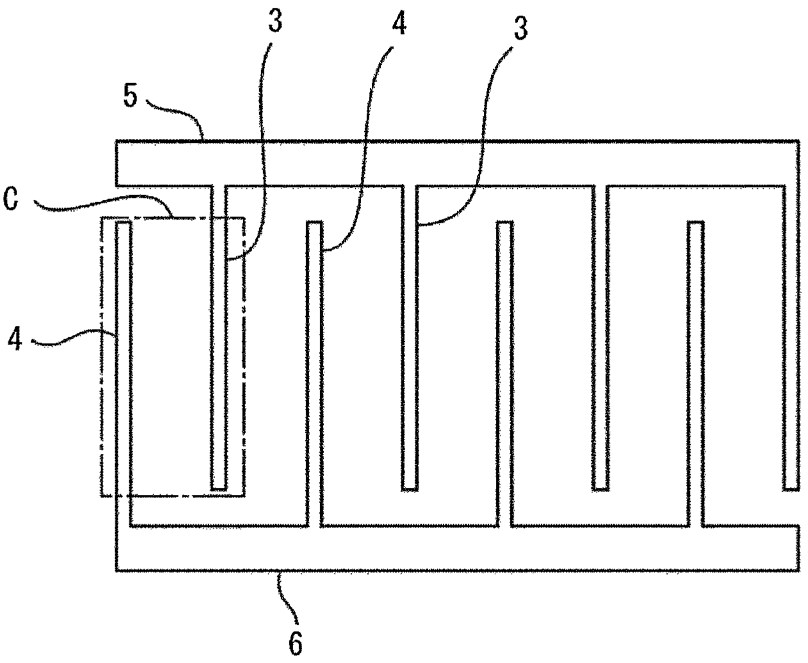
FIG. 1B is a plan view illustrating an electrode structure on a piezoelectric layer.
Figure 2:
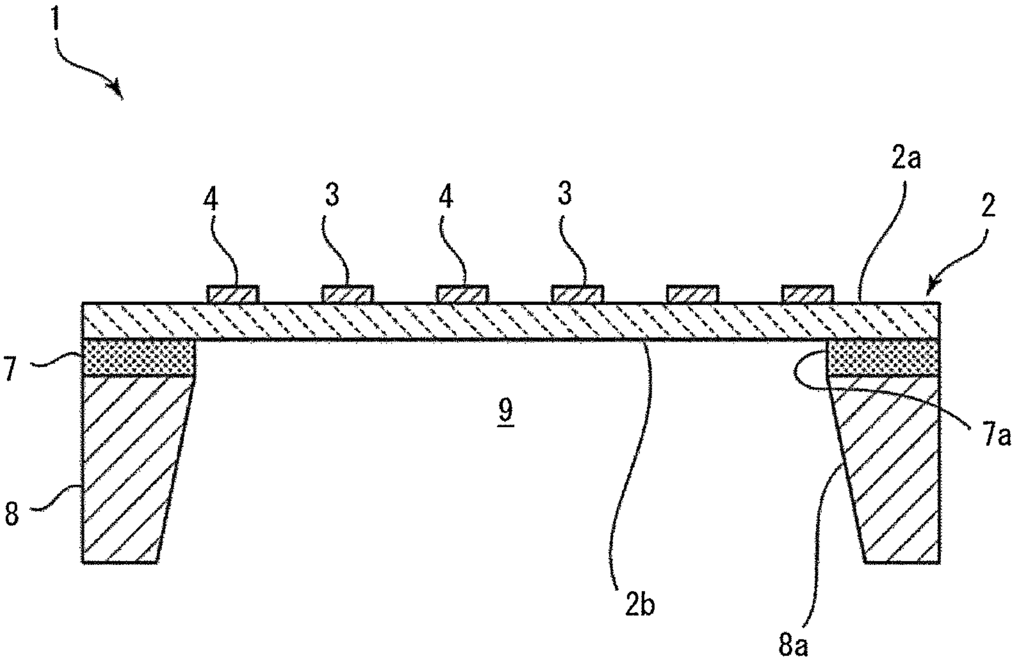
FIG. 2 is a cross-sectional view of a portion taken along a line A-A in FIG. 1A.

FIG. 1A is a schematic perspective view illustrating an external appearance of an acoustic wave device according to a first example embodiment of the present invention, FIG. 1B is a plan view illustrating an electrode structure on a piezoelectric layer, and FIG. 2 is a cross-sectional view of a portion taken along a line A-A in FIG. 1A.

An acoustic wave device 1 includes a piezoelectric layer 2 including, for example, $LiNbO_3$. The piezoelectric layer 2 may include, for example, $LiTaO_3$. A cut-angle of the $LiNbO_3$ or the $LiTaO_3$ is a Z-cut in the present example embodiment, but may be a rotated Y-cut or X-cut. A propagation orientation of, for example, about ±30° of the Y propagation and X propagation is preferred. A thickness of the piezoelectric layer 2 is not particularly limited, but is, for example, preferably about 50 nm or more and about 1000 nm or less in order to effectively excite the thickness-shear mode.

The piezoelectric layer 2 includes first and second principal surfaces 2*a* and 2*b* facing each other. Electrodes 3 and 4 are provided on the first principal surface 2*a*. The electrode 3 is an example of the "first electrode", and the electrode 4 is an example of the "second electrode". In FIGS. 1A and 1B, a plurality of the electrodes 3 includes a plurality of first electrode fingers connected to a first busbar 5. A plurality of the electrodes 4 include a plurality of second electrode fingers connected to a second busbar 6. The plurality of electrodes 3 and the plurality of electrodes 4 are interdigitated with each other.

The electrodes 3 and 4 have a rectangular or substantially rectangular shape and include a longitudinal direction. The electrode 3 and the adjacent electrode 4 face each other in a direction orthogonal or substantially orthogonal to the longitudinal direction. The plurality of electrodes 3, the plurality of electrodes 4, the first busbar 5, and the second busbar 6 define an interdigital transducer (IDT) electrode. The longitudinal direction of the electrodes 3 and 4 and the direction orthogonal or substantially orthogonal to the longitudinal direction of the electrodes 3 and 4 are both directions intersecting a thickness direction of the piezoelectric layer 2. Therefore, it can be said that the electrode 3 and the adjacent electrode 4 face each other in a direction intersecting the thickness direction of the piezoelectric layer 2.

The longitudinal direction of the electrodes 3 and 4 may be interchanged with the direction orthogonal or substantially orthogonal to the longitudinal direction of the electrodes 3 and 4 illustrated in FIGS. 1A and 1B. That is, in FIGS. 1A and 1B, the electrodes 3 and 4 may extend in the direction in which the first busbar 5 and the second busbar 6 extend. In this case, the first busbar 5 and the second busbar 6 extend in the direction in which the electrodes 3 and 4 extend in FIGS. 1A and 1B.

A plurality of structures each including a pair of electrodes defined by the electrode 3 connected to one potential and the electrode 4 connected to the other potential adjacent to each other are provided in a direction orthogonal or substantially orthogonal to the longitudinal direction of the electrodes 3 and 4. In this case, "the electrode 3 and the electrode 4 are adjacent to each other" does not mean that the electrode 3 and the electrode 4 are in direct contact with each other, but means that the electrode 3 and the electrode 4 are disposed with a gap interposed therebetween.

When the electrode 3 and the electrode 4 are adjacent to each other, none of the electrodes including the other electrodes 3 and 4 connected to a hot electrode, a ground electrode, or the like are disposed between the electrode 3 and the electrode 4. The number of pairs of electrodes including the electrodes 3 and 4 is not limited to an integer, and may be 1.5, 2.5, or the like. A center-to-center distance between the electrodes 3 and 4, that is, a pitch therebetween is, for example, preferably in a range from about 1 μm to about 10 μm. The center-to-center distance between the electrodes 3 and 4 is a distance between a center of a width dimension of the electrode 3 in the direction orthogonal or substantially orthogonal to the longitudinal direction of the electrode 3 and a center of a width dimension of the electrode 4 in the direction orthogonal or substantially orthogonal to the longitudinal direction of the electrode 4. In a case where at least one of the electrodes 3 and 4 is provided plurally (in a case where 1.5 or more pairs of electrodes are provided while taking a pair of electrodes 3 and 4 as a pair of electrodes), the center-to-center distance between the electrodes 3 and 4 refers to an average value of the respective center-to-center distances between the adjacent electrodes 3 and 4 among the 1.5 or more pairs of electrodes 3 and 4. The widths of the electrodes 3 and 4, that is, dimensions in a facing direction of the electrodes 3 and 4 are, for example, preferably in a range from about 150 nm to about 1000 nm. The center-to-center distance between the electrodes 3 and 4 is a distance between the center of the dimension (width dimension) of the electrode 3 in the direction orthogonal or substantially orthogonal to the longitudinal direction of the electrode 3 and the center of the dimension (width dimension) of the electrode 4 in the direction orthogonal or substantially orthogonal to the longitudinal direction of the electrode 4.

In the present example embodiment, since the Z-cut piezoelectric layer is used, the direction orthogonal or substantially orthogonal to the longitudinal direction of the electrodes 3 and 4 is a direction orthogonal or substantially orthogonal to a polarization direction of the piezoelectric layer 2. This is not the case when a piezoelectric material with another cut-angle is used as the piezoelectric layer 2. Here, the term "orthogonal" is not limited only to a case of being strictly orthogonal, and is allowed to be substantially orthogonal (an angle formed between the direction orthogonal to the longitudinal direction of the electrodes 3 and 4 and the polarization direction is, for example, about 90°±10°).

A support 8 is laminated on the second principal surface **2*b* side of the piezoelectric layer 2 with an insulating layer 7 interposed therebetween. The insulating layer 7 and the support 8 have a frame shape and include cavities 7*a* and 8*a*, as illustrated in FIG. 2. Thus, a hollow portion 9 is provided. The hollow portion 9 is provided so as not to hinder vibrations of an excitation region C of the piezoelectric layer 2. Accordingly, the support 8 is laminated on the second principal surface 2*b* with the insulating layer 7 interposed therebetween at a position not overlapping a portion where at least one pair of electrodes 3 and 4 is provided. The insulating layer 7 needs not to be provided. Therefore, the support 8 can be directly or indirectly laminated on the second principal surface 2*b* of the piezoelectric layer 2**.

The insulating layer 7 includes, for example, silicon oxide. As the material of the insulating layer 7, an appropriate insulating material such as, for example, silicon oxynitride or alumina may be used other than silicon oxide. The support 8 includes, for example, Si. A plane orientation of a surface of the Si on the piezoelectric layer 2 side may be (100), (110), or (111). Preferably, high-resistance Si having a resistivity of, for example, about 4 kΩ or more is used. The support 8 may be made using an appropriate insulating material or semiconductor material. As the material of the support 8, for example, a piezoelectric material such as aluminum oxide, lithium tantalate, lithium niobate or quartz, various ceramics such as alumina, magnesia, sapphire, silicon nitride, aluminum nitride, silicon carbide, zirconia, cordierite, mullite, steatite or forsterite, a dielectric such as diamond or glass, or a semiconductor such as gallium nitride may be used.

Suitable materials of the plurality of electrodes 3 and 4 and the first and second busbars 5 and 6 are metals or alloys such as, for example, Al or an AlCu alloy. In the present example embodiment, for example, the electrodes 3 and 4 and the first and second busbars 5 and 6 each have a structure in which an Al film is laminated on a Ti film. A close contact layer other than the Ti film may be used.

At the time of driving, an AC voltage is applied between the plurality of electrodes 3 and the plurality of electrodes 4. More specifically, an AC voltage is applied between the first busbar 5 and the second busbar 6. This makes it possible to obtain resonance characteristics utilizing a bulk wave in the thickness-shear mode excited in the piezoelectric layer 2.

In the acoustic wave device 1, d/p is, for example, about 0.5 or less, where d is the thickness of the piezoelectric layer 2 and p is the center-to-center distance between any adjacent electrodes 3 and 4 among the plurality of pairs of electrodes 3 and 4. Due to this, the bulk wave in the thickness-shear mode is effectively excited, and favorable resonance characteristics can be obtained. More preferably, d/p is, for example, 0.24 or less, and in this case, even more favorable resonance characteristics can be obtained.

As in the present example embodiment, in the case where at least one of the electrodes 3 and 4 is provided plurally, that is, in the case where 1.5 or more pairs of electrodes 3 and 4 are provided while taking the electrodes 3 and 4 as a pair of electrodes, the center-to-center distance p between the electrodes 3 and 4 adjacent to each other refers to an average distance of the respective center-to-center distances between the adjacent electrodes 3 and 4.

The acoustic wave device 1 of the present example embodiment has the above-described configuration, such that a drop in the Q value is unlikely to occur even when the number of pairs of electrodes 3 and 4 is decreased to achieve a reduction in size. This is because a resonator is such a resonator that does not need reflectors at both sides thereof and propagation loss is small. Since the bulk wave in the thickness-shear mode is utilized, the above-described reflectors are not needed.

A difference between a Lamb wave utilized in a known acoustic wave device and the bulk wave in the thickness-shear mode will be described with reference to FIGS. 3A and 3B.

Figure 3A:
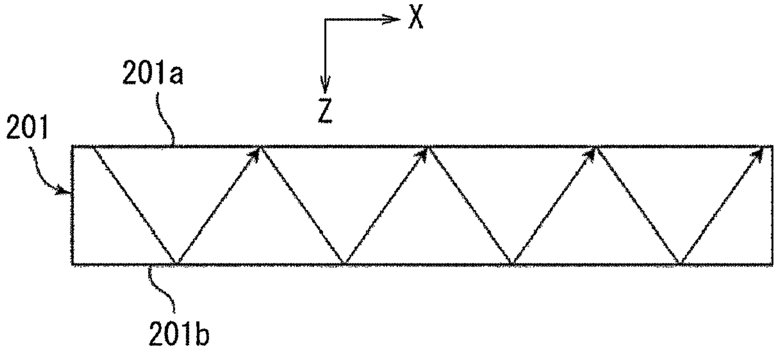
FIG. 3A is a schematic elevational cross-sectional view for explaining a Lamb wave propagating through a piezoelectric film of a known acoustic wave device.

FIG. 3A is a schematic elevational cross-sectional view for explaining a Lamb wave propagating through a piezoelectric film of a known acoustic wave device. A known acoustic wave device is described in, for example, Japanese Unexamined Patent Application Publication No. 2012-257019. As illustrated in FIG. 3A, in the known acoustic wave device, a wave propagates in a piezoelectric film 201 as indicated by arrows. In the piezoelectric film 201, a first principal surface **201*a* and a second principal surface 201*b* face each other, and a thickness direction connecting the first principal surface 201*a* and the second principal surface 201*b* is a Z direction. An X direction is a direction in which the electrode fingers of the IDT electrode are aligned. As illustrated in FIG. 3A, in the case of the Lamb wave, the wave propagates in the X direction as shown in FIG. 3A. Although the piezoelectric film 201** vibrates as a whole because the wave is a plate wave, the wave propagates in the X direction, and thus reflectors are disposed at both sides to obtain resonance characteristics. This causes propagation loss of the wave, and when it is attempted to achieve the miniaturization, that is, when the number of pairs of electrode fingers is reduced, the Q value is reduced.

Figure 3B:
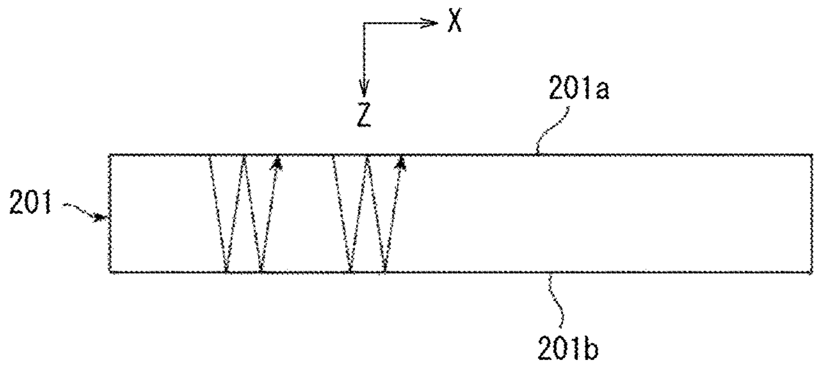
FIG. 3B is a schematic elevational cross-sectional view for explaining a wave of an acoustic wave device according to an example embodiment of the present invention.

In contrast, as illustrated in FIG. 3B, in the acoustic wave device 1 of the present example embodiment, since the vibration is displaced in a thickness-shear direction, the wave propagates in a direction connecting the first principal surface 2*a* and the second principal surface 2*b* of the piezoelectric layer 2, that is, substantially propagates in the Z direction, and resonates. That is, the X-direction component of the wave is significantly smaller than the Z-direction component thereof. Since the resonance characteristics are obtained by the propagation of the wave in the Z direction, no reflector is needed. Accordingly, the propagation loss caused when the wave propagates to the reflector does not occur. Therefore, even in a case where the number of pairs of electrodes including the electrodes 3 and 4 is decreased to achieve a reduction in size, a drop in the Q value is unlikely to occur.

Figure 4:
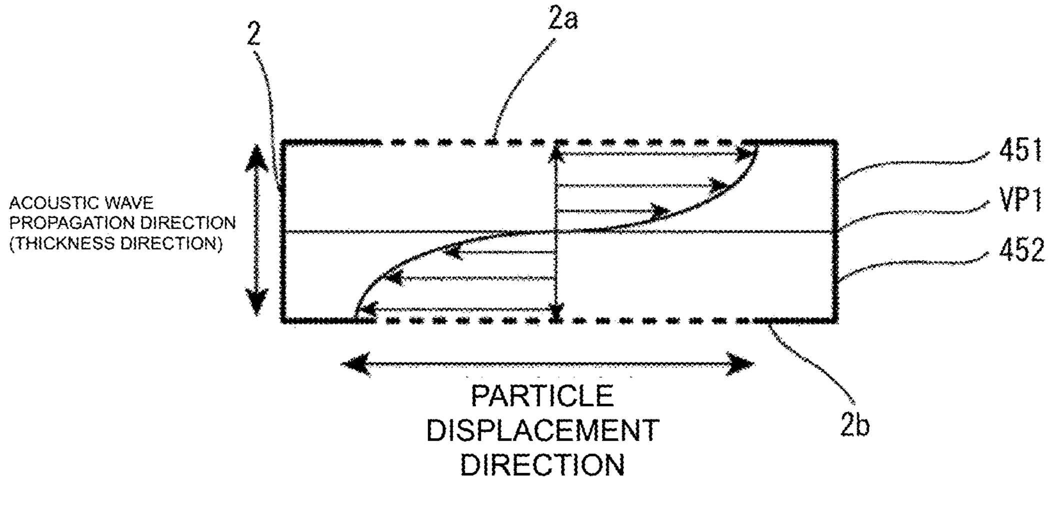
FIG. 4 is a schematic diagram illustrating a bulk wave when a voltage is applied between a first electrode and a second electrode such that a potential of the second electrode is higher than a potential of the first electrode.

As illustrated in FIG. 4, an amplitude direction of a bulk wave in the thickness-shear mode is reversed between a first region 451 included in the excitation region C of the piezoelectric layer 2 and a second region 452 included in the excitation region C thereof. FIG. 4 schematically illustrates the bulk wave when a voltage is applied between the electrode 3 and the electrode 4 such that a potential of the electrode 4 is higher than a potential of the electrode 3. In the excitation region C, the first region 451 is a region between the first principal surface 2*a* and a virtual plane VP1 being orthogonal or substantially orthogonal to the thickness direction of the piezoelectric layer 2 and dividing the piezoelectric layer 2 into two portions. In the excitation region C, the second region 452 is a region between the virtual plane VP1 and the second principal surface 2*b*.

As described above, in the acoustic wave device 1, at least one pair of electrodes including the electrodes 3 and 4 is disposed, but the purpose of the disposition is not to propagate the wave in the X direction. Therefore, it is not necessary that the number of pairs of electrodes including the electrodes 3 and 4 is plural. In other words, it is only necessary to provide at least one pair of electrodes.

For example, the electrode 3 is an electrode connected to a hot potential, and the electrode 4 is an electrode connected to a ground potential. The electrode 3 may be connected to the ground potential, and the electrode 4 may be connected to the hot potential. In the present example embodiment, as described above, at least one pair of electrodes refers to electrodes connected to the hot potential or electrodes connected to the ground potential, and no floating electrode is provided.

Figure 5:
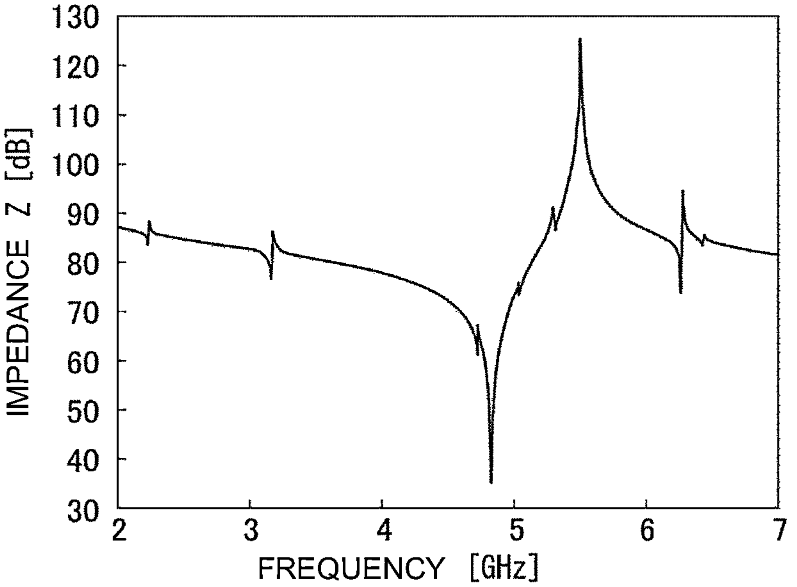
FIG. 5 is a diagram showing resonance characteristics of an acoustic wave device according to a first example embodiment of the present invention.

FIG. 5 is a diagram showing resonance characteristics of the acoustic wave device according to the first example embodiment of the present invention. Design parameters of the acoustic wave device 1 having the shown resonance characteristics are as follows.

Piezoelectric layer 2: $LiNbO_3$ with Euler angles (0°, 0°, 90°), thickness=about 400 nm.

When viewed in a direction orthogonal to the longitudinal direction of the electrodes 3 and 4, a length of a region where the electrodes 3 and 4 overlap each other, i.e., a length of the excitation region C is about 40 μm, the number of pairs of electrodes constituted of the electrodes 3 and 4 is 21, the center-to-center distance between the electrodes is about 3 μm, the width of the electrodes 3 and 4 is about 500 nm, and d/p is about 0.133.

Insulating layer 7: a silicon oxide film having a thickness of about 1 μm.

Support 8: Si.

The length of the excitation region C refers to a dimension of the excitation region C along the longitudinal direction of the electrodes 3 and 4.

In the present example embodiment, the distance between the electrodes of the pair of electrodes including the electrodes 3 and 4 was equal or substantially equal across all of the plurality of pairs. That is, the electrodes 3 and the electrodes 4 were disposed at an equal or substantially equal pitch.

As is clear from FIG. 5, although no reflector is provided, favorable resonance characteristics with a fractional bandwidth being about 12.5% are obtained.

As described above, in the present example embodiment, d/p is, for example, about 0.5 or less, and more preferably is, for example, about 0.24 or less, where d is the thickness of the piezoelectric layer 2 and p is the center-to-center distance between the electrodes 3 and 4. This will be described with reference to FIG. 6.

Figure 6:
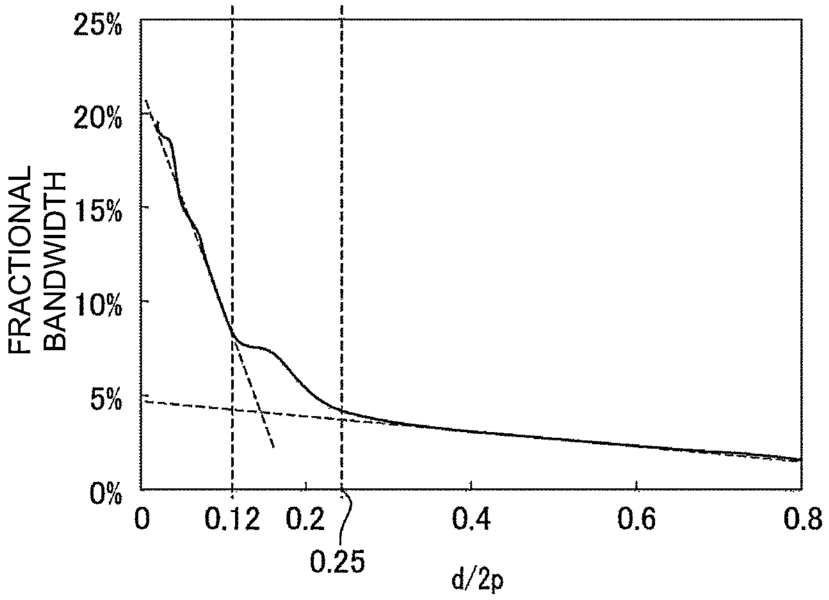
FIG. 6 is a diagram showing a relationship between d/2p and a fractional bandwidth as a resonator of an acoustic wave device according to an example embodiment of the present invention.

Similar to the acoustic wave device having obtained the resonance characteristics depicted in FIG. 5, a plurality of the acoustic wave devices were achieved through changing d/2p. FIG. 6 is a diagram showing a relationship between d/2p and a fractional bandwidth as a resonator of the acoustic wave device.

As is clear from FIG. 6, when d/2p exceeds about 0.25, i.e., when d/p is greater than about 0.5, the fractional bandwidth is less than about 5% even when d/p is adjusted, for example. In contrast, when d/2p≤about 0.25, i.e., d/p≤about 0.5, the fractional bandwidth can be increased to about 5% or more by changing d/p within the above range, for example, that is, a resonator having a high coupling coefficient can be provided. When d/2p is about 0.12 or less, i.e., when d/p is about 0.24 or less, the fractional bandwidth can be increased to about 7% or more, for example. In addition, when d/p is adjusted within this range, a resonator having a wider fractional bandwidth can be obtained, and a resonator having a higher coupling coefficient can be achieved. Accordingly, it was discovered that, by setting d/p to be, for example, about 0.5 or less as in an acoustic wave device according to an example embodiment of the present invention, a resonator having a high coupling coefficient utilizing the bulk wave in the thickness-shear mode can be provided.

As described above, at least a pair of electrodes may be one pair, and p is the center-to-center distance between the adjacent electrodes 3 and 4 in the case of one pair of electrodes. In the case of 1.5 or more pairs of electrodes, it is sufficient that the average distance of the respective center-to-center distances between the adjacent electrodes 3 and 4 is denoted as p.

As for the thickness d of the piezoelectric layer, in the case where there is a variation in thickness of the piezoelectric layer 2, it is sufficient to use a value obtained by averaging the thicknesses thereof.

Figure 7:
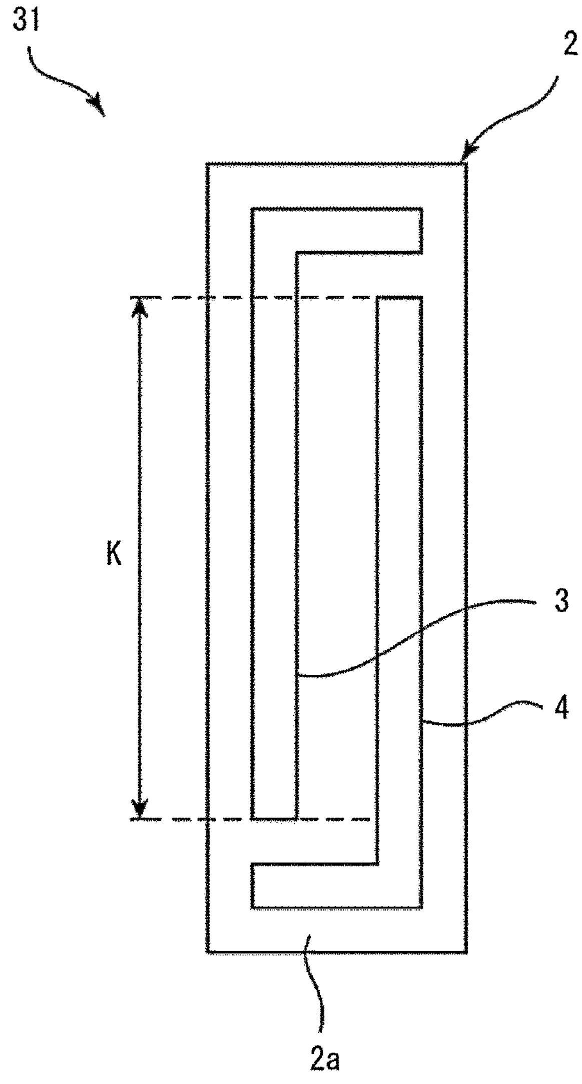
FIG. 7 is a plan view of another acoustic wave device according to the first example embodiment of the present invention.

FIG. 7 is a plan view of another acoustic wave device according to the first example embodiment of the present invention. In an acoustic wave device 31, a pair of electrodes including the electrodes 3 and 4 is provided on the first principal surface 2*a* of the piezoelectric layer 2. K in FIG. 7 is an overlap width. As described above, in the acoustic wave device 31 of the present example embodiment, the number of pairs of electrodes may be one. In this case as well, when d/p is, for example, about 0.5 or less, a bulk wave in the thickness-shear mode can be effectively excited.

In the acoustic wave device 1, it is preferable that, with respect to an excitation region where any adjacent electrodes 3 and 4 among the plurality of electrodes 3 and electrodes 4 overlap each other when viewed in the direction in which the above adjacent electrodes 3 and 4 face each other, a metallization ratio MR of the adjacent electrodes 3 and 4 satisfies a relationship of, for example, MR≤about 1.75 (d/p)+0.075. That is, when viewed in the direction in which the plurality of first electrode fingers and the plurality of second electrode fingers adjacent to each other face each other, a region in which the plurality of first electrode fingers and the plurality of second electrode fingers overlap each other is an excitation region (overlap region). When the metallization ratio of the plurality of first electrode fingers and the plurality of second electrode fingers with respect to the excitation region is represented by MR, it is preferable to satisfy the relationship of, for example, MR≤about 1.75 (d/p)+0.075. In this case, a spurious emission may be effectively reduced.

Figure 8:
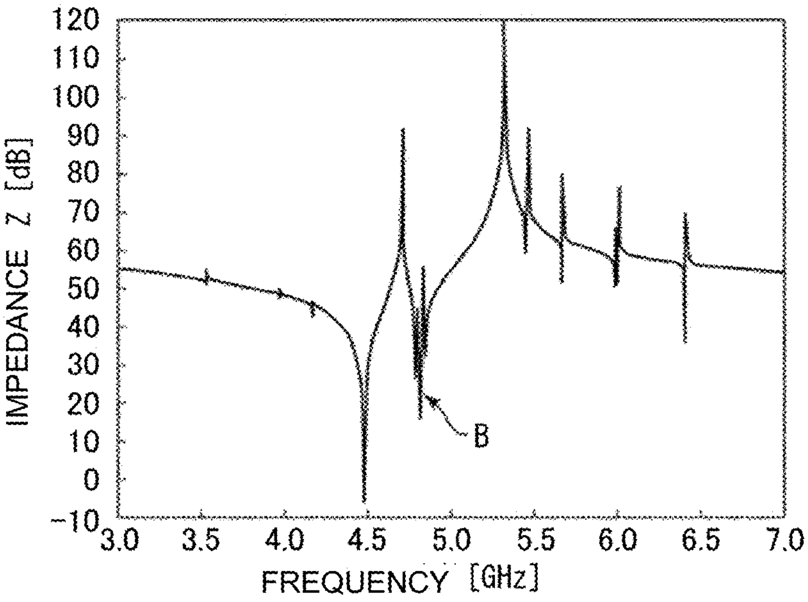
FIG. 8 is a reference diagram showing an example of resonance characteristics of an acoustic wave device.

This will be described with reference to FIGS. 8 and 9. FIG. 8 is a reference diagram showing an example of the resonance characteristics of the acoustic wave device 1. A spurious emission indicated by an arrow B appears between a resonant frequency and an anti-resonant frequency. For example, d/p was equal to about 0.08 and Euler angles of $LiNbO_3$ were (0°, 0°, 90°). The metallization ratio MR was set to, for example, about 0.35.

The metallization ratio MR will be explained with reference to FIG. 1B. In the electrode structure illustrated in FIG. 1B, when a certain pair of electrodes 3 and 4 is focused on, it is considered that only this pair of electrodes 3 and 4 is provided. In this case, a section surrounded by a chain line C is an excitation region. When the electrode 3 and the electrode 4 are viewed in a direction orthogonal or substantially orthogonal to the longitudinal direction of the electrodes 3 and 4, that is, viewed in the facing direction, the excitation region refers to a region in the electrode 3 that overlaps the electrode 4, a region in the electrode 4 that overlaps the electrode 3, and a region between the electrode 3 and the electrode 4 where the electrode 3 and the electrode 4 overlap each other. A ratio of an area of the electrodes 3 and 4 in the excitation region C to an area of the excitation region is the metallization ratio MR. That is, the metallization ratio MR is a ratio of an area of a metallization portion to the area of the excitation region.

When a plurality of pairs of electrodes is provided, it is sufficient that the ratio of the metallization portion included in the entire excitation region to the total area of the excitation region is defined as MR.

Figure 9:
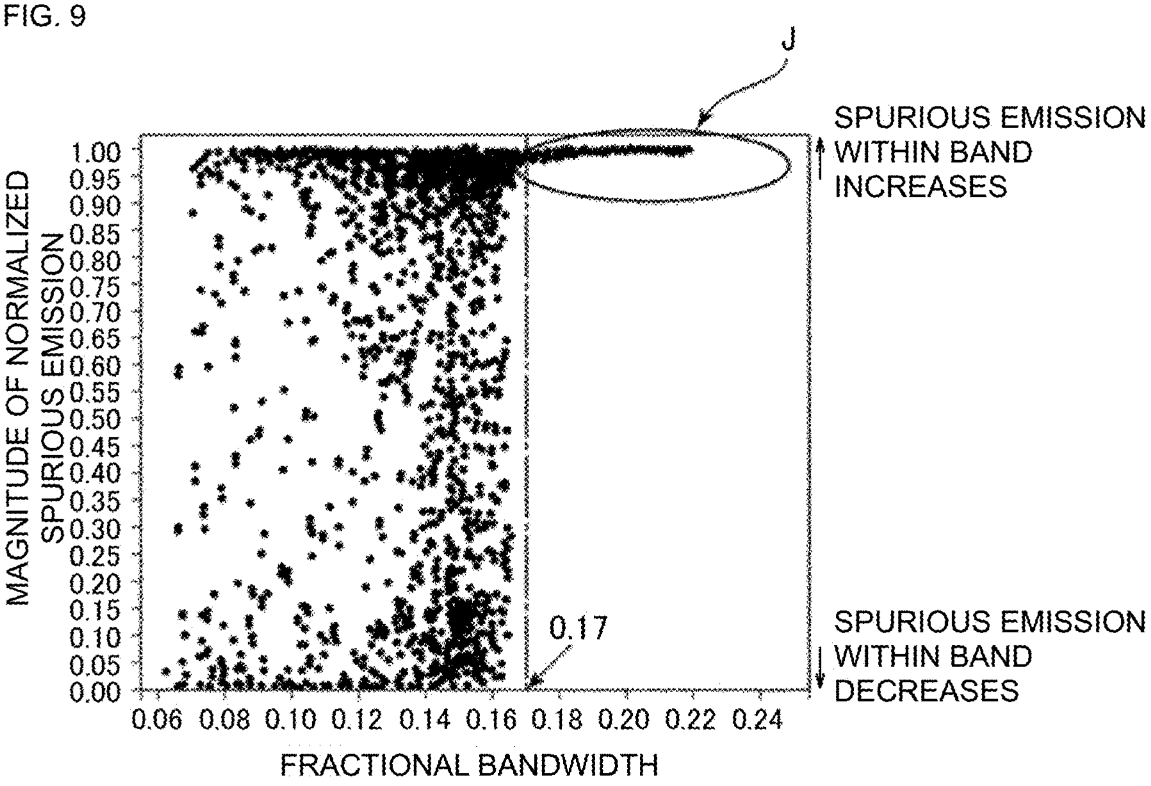
FIG. 9 is a diagram showing a relationship between a fractional bandwidth and a phase rotation quantity of spurious impedance normalized by about 180 degrees as a magnitude of a spurious emission in a case where a large number of acoustic wave resonators are provided.

In accordance with the present example embodiment, FIG. 9 is a diagram showing a relationship between a fractional bandwidth and a phase rotation quantity of spurious impedance normalized by about 180 degrees as magnitude of a spurious emission in a case where a large number of acoustic wave resonators are constituted. The fractional bandwidth was adjusted by variously changing the film thickness of the piezoelectric layer, the dimensions of the electrodes, and the like. FIG. 9 shows a result obtained when a piezoelectric layer including Z-cut $LiNbO_3$ is used, but the same or substantially the same tendency is obtained when a piezoelectric layer with another cut-angle is used.

In a region surrounded by an ellipse J in FIG. 9, a spurious emission is increased to be about 1.0, for example. As is clear from FIG. 9, in a case where the fractional bandwidth exceeds about 0.17, that is, when the fractional bandwidth exceeds about 17%, for example, a large spurious emission having a spurious level of about 1 or more appears in a pass band even when parameters defining the fractional bandwidth are changed. That is, as in the resonance characteristics depicted in FIG. 8, a large spurious emission indicated by the arrow B appears within the band. Accordingly, the fractional bandwidth is, for example, preferably about 17% or less. In this case, the spurious emission may be reduced by adjusting the thickness of the piezoelectric layer 2, the dimensions of the electrodes 3 and 4, or the like.

Figure 10:
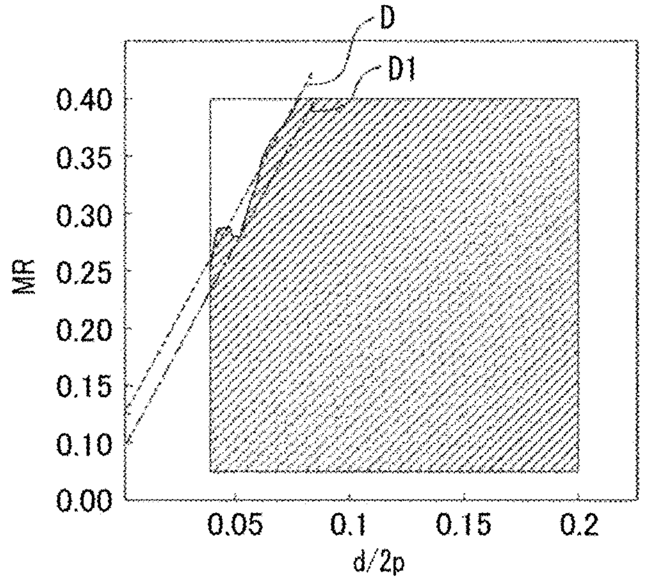
FIG. 10 is a diagram showing a relationship between d/2p, a metallization ratio MR, and a fractional bandwidth.

FIG. 10 is a diagram showing a relationship between d/2p, the metallization ratio MR, and a fractional bandwidth. In the acoustic wave device, various acoustic wave devices having different values of d/2p and MR were provided, and the fractional bandwidths were measured. A hatched portion on the right side of a broken line D in FIG. 10 is a region where the fractional bandwidth is about 17% or less, for example. A boundary between the hatched region and an unhatched region is represented by an expression of MR=about 3.5 (d/2p)+0.075, for example. That is, MR is equal to about 1.75 (d/p)+0.075. Accordingly, for example, the following relationship is preferably satisfied: MR≤about 1.75 (d/p)+0.075. In this case, the fractional bandwidth is easily set to about 17% or less, for example. More preferable is a region on the right side of an expression of MR=about 3.5 (d/2p)+0.05, for example, which is indicated by a chain line D1 in FIG. 10. That is, when a relationship of MR≤about 1.75 (d/p)+0.05 is satisfied, the fractional bandwidth can be reliably set to about 17% or less, for example.

Figure 11:
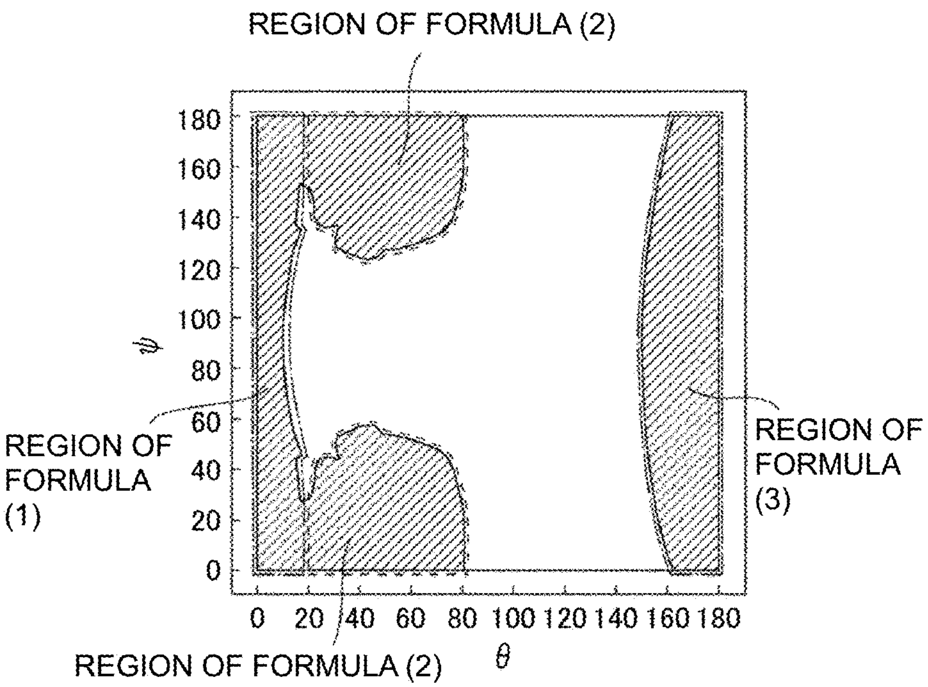
FIG. 11 is a diagram showing a map of a fractional bandwidth with respect to Euler angles (0°, θ, ψ) of $LiNbO_3$ in a case where d/p approaches 0 as much as possible.

FIG. 11 is a diagram showing a map of a fractional bandwidth with respect to Euler angles (0°, θ, ψ) of $LiNbO_3$ in a case where d/p approaches 0 as much as possible. A hatched portion in FIG. 11 is a region where a fractional bandwidth of at least about 5% or more is obtained, for example. When the range of the region is approximated, obtained are ranges represented by Formula (1), Formula (2), and Formula (3).

$$(0° \pm 10°,\ 0° \text{ to } 20°,\ \text{any } \psi) \qquad \text{Formula (1)}$$

$$(0° \pm 10°,\ 20° \text{ to } 80°,\ 0° \text{ to } 60°(1-(\theta-50)^2/900)^{1/2}) \text{ or} \qquad \text{Formula (2)}$$

$$(0° \pm 10°,\ 20° \text{ to } 80°,\ [180°-60°(1-(\theta-50)^2/900)^{1/2}] \text{ to } 180°)$$

$$(0° \pm 10°,\ [180°-30°(1-(\psi-90)^2/8100)^{1/2}] \text{ to } 180°,\ \text{any } \psi) \qquad \text{Formula (3)}$$

Therefore, the above-described Euler angles range of Formula (1), (2), or (3) is preferable because the fractional bandwidth can be sufficiently widened.

Figure 12:
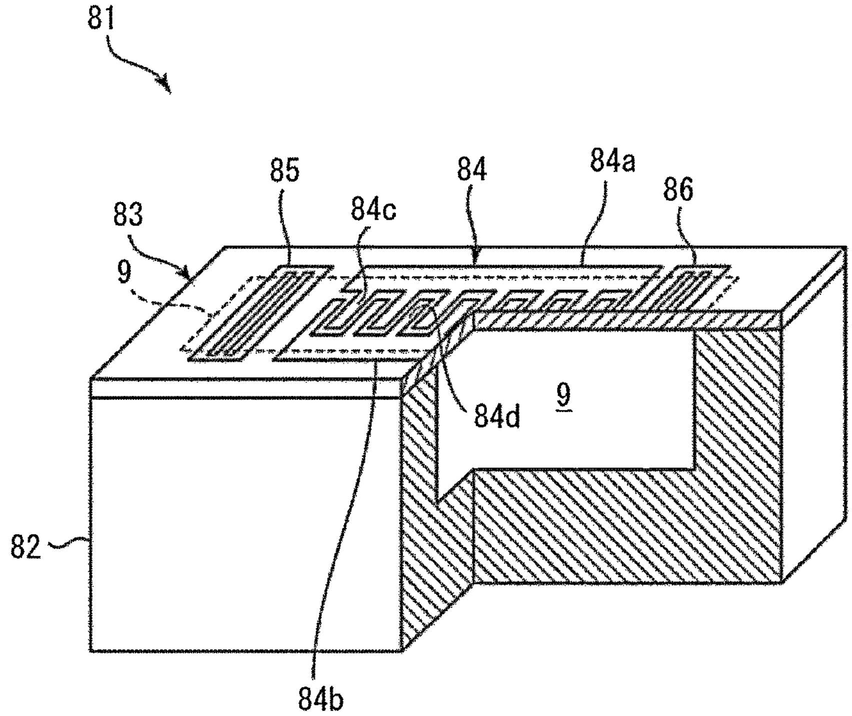
FIG. 12 is a partially cutaway perspective view for explaining an acoustic wave device according to the first example embodiment of the present invention.

FIG. 12 is a partially cutaway perspective view for explaining the acoustic wave device according to the first example embodiment of the present invention. An acoustic wave device 81 includes a support substrate 82. The support substrate 82 includes a recess opened to an upper surface. A piezoelectric layer 83 is laminated on the support substrate 82. With this, the hollow portion 9 is provided. An IDT electrode 84 is provided on the piezoelectric layer 83 above the hollow portion 9. Reflectors 85 and 86 are provided at both sides in an acoustic wave propagation direction of the IDT electrode 84. In FIG. 12, an outer peripheral edge of the hollow portion 9 is indicated by a broken line. In this case, the IDT electrode 84 includes first and second busbars 84*a* and 84*b*, a plurality of electrodes 84*c* as first electrode fingers, and a plurality of electrodes 84*d* as second electrode fingers. The plurality of electrodes 84*c* are connected to the first busbar 84*a*. The plurality of electrodes 84*d* are connected to the second busbar 84*b*. The plurality of electrodes 84*c* and the plurality of electrodes 84*d* are interdigitated with each other.

In the acoustic wave device 81, an AC electric field is applied to the IDT electrode 84 above the hollow portion 9 to excite a Lamb wave as a plate wave. Since the reflectors 85 and 86 are provided at both the sides, resonance characteristics provided by the Lamb wave can be obtained.

As described above, an acoustic wave device according to an example embodiment of the present invention may utilize a plate wave.

Second Example Embodiment

An acoustic wave device of a second example embodiment of the present invention will be described below. In the second example embodiment, description of the same or corresponding contents as those in the first example embodiment will be omitted as appropriate. The contents described in the first example embodiment may be applied to the second example embodiment.

Figure 13:
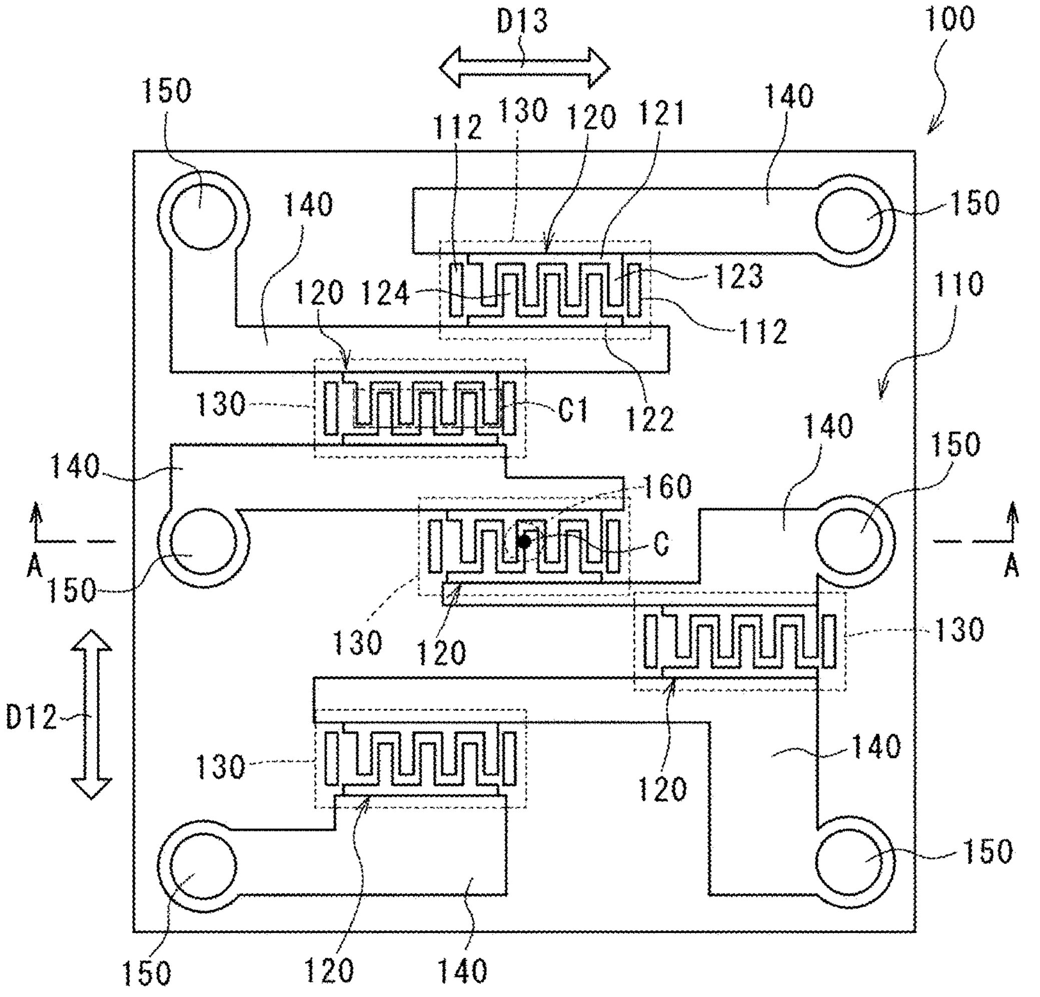
FIG. 13 is a schematic plan view of an acoustic wave device according to a second example embodiment of the present invention.
Figure 14:
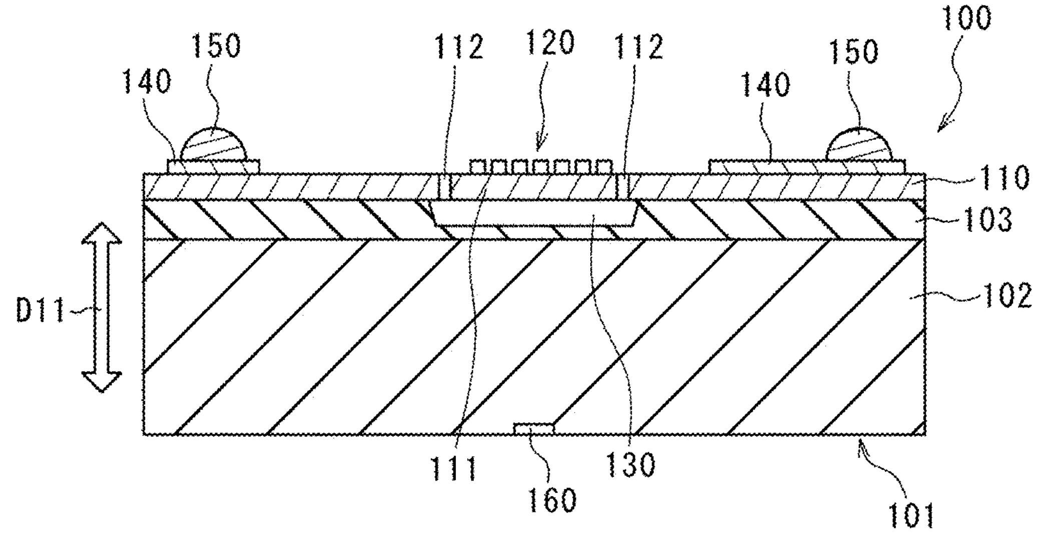
FIG. 14 is a schematic cross-sectional view of the acoustic wave device taken along a line A-A in FIG. 13.

FIG. 13 is a schematic plan view of the acoustic wave device according to the second example embodiment of the present invention. A schematic cross-sectional view of the acoustic wave device taken along a line A-A in FIG. 13 is described. As illustrated in FIGS. 13 and 14, an acoustic wave device 100 includes a support 101, a piezoelectric layer 110, and a resonator 120. The support 101 is provided with a hollow portion 130, and a wiring electrode 140 is electrically connected to the resonator 120. A bump 150 electrically connected to the wiring electrode 140 is provided on the wiring electrode 140. In the present specification, the acoustic wave device 100 may be referred to as an acoustic wave element 100.

The support 101 includes a support substrate 102 and an intermediate layer 103. For example, the support 101 includes a multilayer body including the support substrate 102 including Si and the intermediate layer 103 laminated on the support substrate 102 and including SiOx. It is sufficient that the support 101 includes the support substrate 102, and does not need to include the intermediate layer 103. In the present specification, the intermediate layer 103 may be referred to as a bonding layer 103.

The support substrate 102 is a substrate having a thickness in a first direction D11. In the present specification, the "first direction" is a thickness direction of the support substrate 102, and means a lamination direction in which the support 101 and the piezoelectric layer 110 are laminated. The intermediate layer 103 is provided on a principal surface of the support substrate 102 facing the piezoelectric layer 110.

The support 101 includes the hollow portion 130. In the present specification, the hollow portion 130 may be referred to as a space portion 130.

A plurality of the hollow portions 130 may be provided. The hollow portion 130 is provided between the support 101 and the piezoelectric layer 110. In other words, the hollow portion 130 is a space defined by the support 101 and the piezoelectric layer 110. In the present example embodiment, the hollow portion 130 is provided in the intermediate layer 103. Specifically, a recess that is opened to a surface of the intermediate layer 103 on the opposite side to a surface thereof in contact with the support substrate 102 is provided. The hollow portion 130 is defined by the recess being covered with the piezoelectric layer 110.

It is sufficient for the hollow portion 130 to be provided in a portion of the support 101. In a case where the support 101 does not include the intermediate layer 103, the hollow portion 130 may be provided in the support substrate 102.

The piezoelectric layer 110 is provided on the support 101. The piezoelectric layer 110 is laminated in the first direction D11 of the support 101. In the present example embodiment, the piezoelectric layer 110 is provided on the intermediate layer 103. Specifically, the piezoelectric layer 110 is provided on the surface of the intermediate layer 103 on the opposite side to the surface thereof in contact with the support substrate 102. In the present specification, the piezoelectric layer 110 may be referred to as a piezoelectric material layer 110.

In the present specification, a portion of the piezoelectric layer 110 located in a region overlapping the hollow portion 130 in plan view in the first direction D11 is referred to as a membrane portion 111. The expression "in plan view in the first direction D11" means viewing from the lamination direction of the support 101 and the piezoelectric layer 110. The expression "in a lamination direction of a support and a piezoelectric material layer" according to the present disclosure means "in plan view in the first direction D11".

It is only necessary for the hollow portion 130 is provided in the support 101 at a position overlapping at least a portion of the resonator 120 in plan view in the first direction D11. One hollow portion of the plurality of hollow portions 130 is located at a center of the support substrate 102 in plan view in the first direction D11. In other words, one hollow portion of the plurality of hollow portions 130 is located at the center of the support substrate 102 in the lamination direction of the support 101 and the piezoelectric layer 110. In the present specification, the "center" may be a center of a drawing in plan view in the first direction D11, or may be a position of a center of gravity in plan view in the first direction D11. The center is not limited to a center in a strict sense. In plan view in the first direction D11, a center C of the acoustic wave device 100, a center of the support 101 (support substrate 102), and a center of the piezoelectric layer 110 coincide with each other. That is, the "center C of the acoustic wave device 100", the "center of the support 101 (support substrate 102)", and the "center of the piezoelectric layer 110" can be mutually restated.

In the acoustic wave device 100 illustrated in FIG. 13 and FIG. 14, the support 101 includes a abutting mark 160, which is a contact mark with a abutting pin 312 (illustrated in FIG. 21), on a surface opposite to a surface in contact with the piezoelectric layer 110. The abutting mark 160 may be a recess or a flaw, or may be a fragment of a dicing tape 310 (illustrated in FIG. 21) described later. The abutting mark 160 is located at a position overlapping the hollow portion 130 in plan view in the first direction D11. In other words, the abutting mark 160 is located at a position overlapping the hollow portion 130 in the lamination direction of the support 101 and the piezoelectric layer 110. To be specific, the abutting mark 160 is located at the center of the support substrate 102 in plan view in the first direction D11.

The piezoelectric layer 110 includes, for example, LiNbOx or LiTaOx. In other words, the piezoelectric layer 110 includes, for example, lithium niobate or lithium tantalate. The piezoelectric layer 110 is thinner than the intermediate layer 103.

The resonator 120 is provided plurally. Each resonator 120 includes a functional electrode provided on the piezoelectric layer 110. That is, the functional electrode is provided plurally. In the present specification, the functional electrode may be referred to as an electrode portion. In the present example embodiment, the functional electrode is, for example, an interdigital transducer (IDT) electrode. The IDT electrode includes a first busbar 121 and a second busbar 122 facing each other, a plurality of first electrode fingers 123 connected to the first busbar 121, and a plurality of second electrode fingers 124 connected to the second busbar 122.

The plurality of first electrode fingers 123 and the plurality of second electrode fingers 124 are interdigitated with each other, and the first electrode finger 123 and the second electrode fingers 124 adjacent to each other are paired to define an electrode set.

The plurality of first electrode fingers 123 and the plurality of second electrode fingers 124 extend in a second direction D12 intersecting the first direction D11, and are disposed to overlap each other when viewed from a third direction D13 orthogonal or substantially orthogonal to the second direction D12. The second direction D12 is a direction intersecting the lamination direction in which the support 101 and the piezoelectric layer 110 are laminated, in a plane direction of the piezoelectric layer 110. The plane direction of the piezoelectric layer 110 is a direction in which a front surface of the piezoelectric layer 110 extends in plan view in the first direction D11. The third direction D13 is a direction orthogonal or substantially orthogonal to the second direction D12 in plan view in the first direction D11, and is also a direction in which the plurality of first electrode fingers 123 and the plurality of second electrode fingers 124 are aligned. That is, the third direction D13 is a facing direction in which the plurality of first electrode fingers 123 and the plurality of second electrode fingers 124 adjacent to each other face each other.

When viewed from the first direction D11, the plurality of first electrode fingers 123 and the plurality of second electrode fingers 124 are adjacent to and face each other. When viewed from the third direction D13, the plurality of first electrode fingers 123 and the plurality of second electrode fingers 124 overlap with each other. That is, the plurality of first electrode fingers 123 and the plurality of second electrode fingers 124 are alternately disposed in the third direction D13. Specifically, the first electrode finger 123 and the second electrode finger 124 adjacent to each other are disposed to face each other, and are paired to define an electrode set. In the resonator 120, a plurality of the electrode sets are disposed in the third direction D13.

The plurality of first electrode fingers 123 extend in the second direction D12 intersecting the first direction D11. Base ends of the plurality of first electrode fingers 123 are connected to the first busbar 121. The plurality of second electrode fingers 124 face any of the plurality of first electrode fingers 123 in the third direction D13 orthogonal or substantially orthogonal to the second direction D12 and extends in the second direction D12. Base ends of the plurality of second electrode fingers 124 are connected to the second busbar 122.

A region in which the plurality of first electrode fingers 123 and the plurality of second electrode fingers 124 overlap each other in the third direction D13 is an excitation region C1. That is, the excitation region C1 is a region where the plurality of first electrode fingers 123 and the plurality of second electrode fingers 124 overlap each other when viewed in a direction in which the adjacent first electrode fingers 123 and second electrode fingers 124 face each other, that is, when viewed in the third direction D13. In the present specification, the excitation region C1 may be referred to as an overlap region C1.

Each IDT electrode is provided on the piezoelectric layer 110 at a position overlapping the hollow portion 130 in plan view in the first direction D11. To be specific, the hollow portion 130 is provided at a position overlapping the first busbar 121, the second busbar 122, the plurality of first electrode fingers 123, and the plurality of second electrode fingers 124 in plan view in the first direction D11. In other words, the IDT electrode is provided in the membrane portion 111. It is sufficient for the IDT electrode to be provided in at least a portion of the membrane portion 111 in plan view in the first direction D11. One IDT electrode of the plurality of IDT electrodes is located at the center of the support substrate 102 in plan view in the first direction D11. In other words, one IDT electrode of the plurality of IDT electrodes is located at the center of the support substrate 102 in the lamination direction of the support 101 and the piezoelectric layer 110.

As illustrated in FIG. 13, the IDT electrode is connected to the wiring electrode 140. Specifically, the wiring electrode 140 is provided to the first busbar 121 and the second busbar 122. The wiring electrode 140 is electrically connected to the first busbar 121 and the second busbar 122.

The wiring electrode 140 overlaps each of the first busbar 121 and the second busbar 122 in plan view in the first direction D11.

It is sufficient that the wiring electrode 140 is provided for at least one of the first busbar 121 and the second busbar 122.

The bump 150 is provided on the wiring electrode 140. The bump 150 is electrically connected to the wiring electrode 140.

A dielectric film may be provided on the piezoelectric layer 110 to cover the IDT electrode. The dielectric film does not need to be provided.

The piezoelectric layer 110 includes a plurality of through holes 112 extending to reach the hollow portion 130. The plurality of through holes 112 are provided at both outer side portions of the IDT electrode in the third direction D13 in plan view in the first direction D11. The plurality of through holes 112 communicate with the hollow portion 130. The plurality of through holes 112 have, for example, a rectangular or substantially rectangular shape in plan view in the first direction D11.

Method for Manufacturing Acoustic Wave Device

Hereinafter, an example of a method for manufacturing the acoustic wave device according to the second example embodiment (the acoustic wave device 100 illustrated in FIGS. 13 and 14) will be described with reference to FIGS. 15 to 24. In the following description, a process of mounting the manufactured acoustic wave device 100 on a mounting substrate 301 (illustrated in FIG. 24) will also be described.

Figure 15:
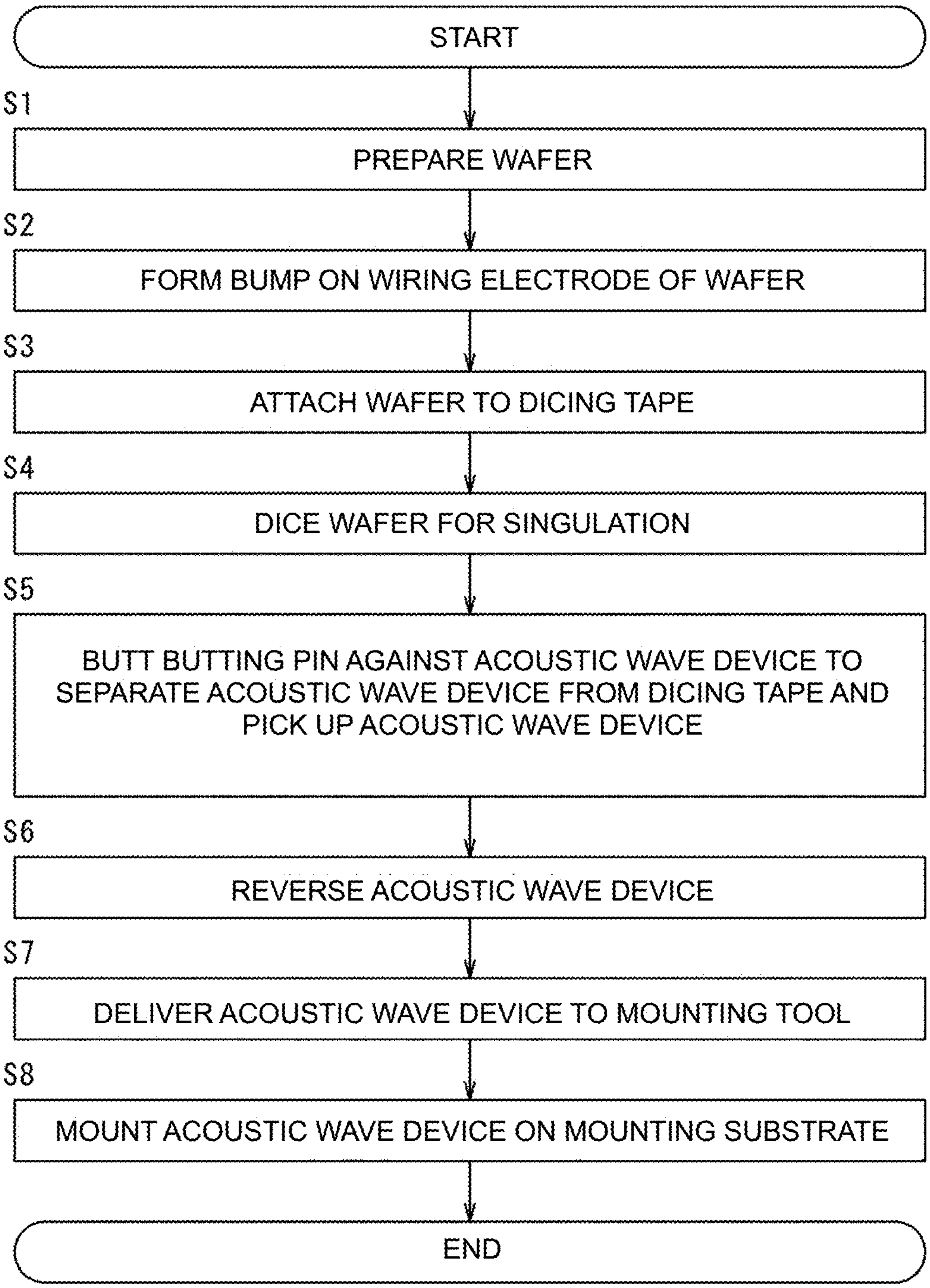
FIG. 15 is a flowchart for explaining a method for manufacturing the acoustic wave device in FIG. 13.
Figure 16:
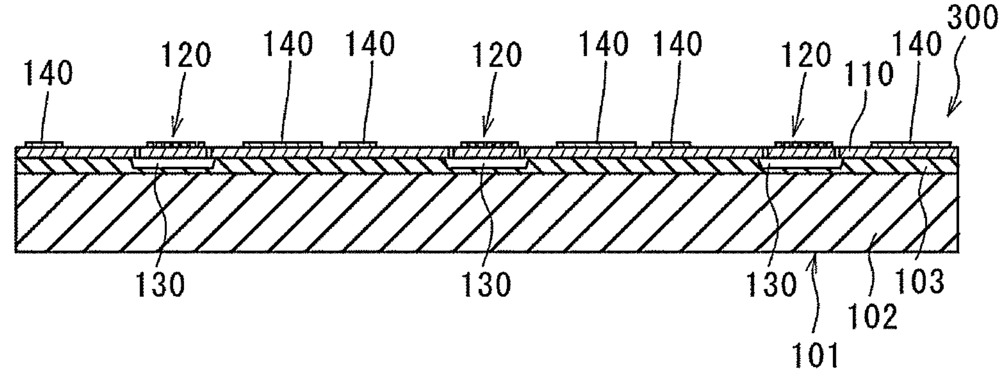
FIG. 16 is a diagram for explaining the method for manufacturing the acoustic wave device in FIG. 13.

Referring to FIG. 15, in step S1, the wafer 300 is prepared as illustrated in FIG. 16. The wafer 300 includes the support 101, the piezoelectric layer 110, the resonator 120, the hollow portion 130, and the wiring electrode 140.

Figure 17:
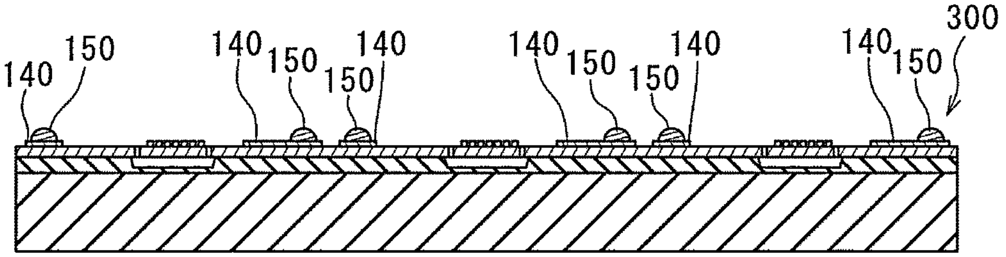
FIG. 17 is a diagram for explaining the method for manufacturing the acoustic wave device in FIG. 13.

In step S2, as illustrated in FIG. 17, the bump 150 is formed on the wiring electrode 140 of the wafer 300. The formation of the bump 150 may be performed by a known method.

Figure 18:
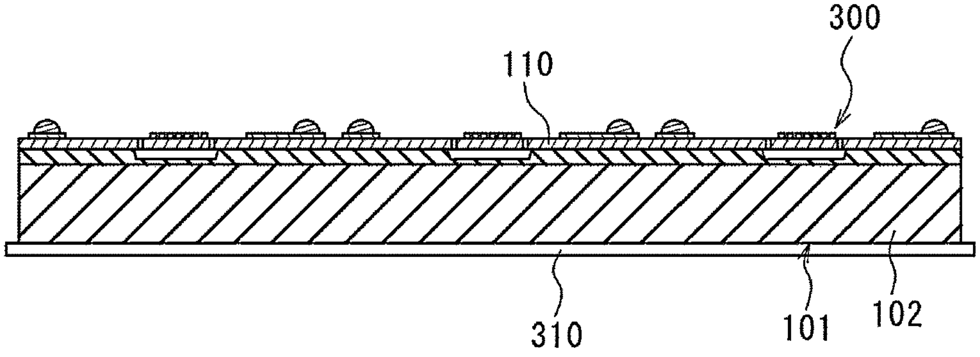
FIG. 18 is a diagram for explaining the method for manufacturing the acoustic wave device in FIG. 13.

In step S3, as illustrated in FIG. 18, the wafer 300 is attached to the dicing tape 310. Specifically, a surface of the support 101 of the wafer 300 on a side opposite to the piezoelectric layer 110 is attached to the dicing tape 310. That is, the support substrate 102 of the wafer 300 is attached to the dicing tape 310. The dicing tape 310 is, for example, an ultraviolet curable adhesive tape, and adhesion thereof is reduced when irradiated with ultraviolet rays.

Figure 19:
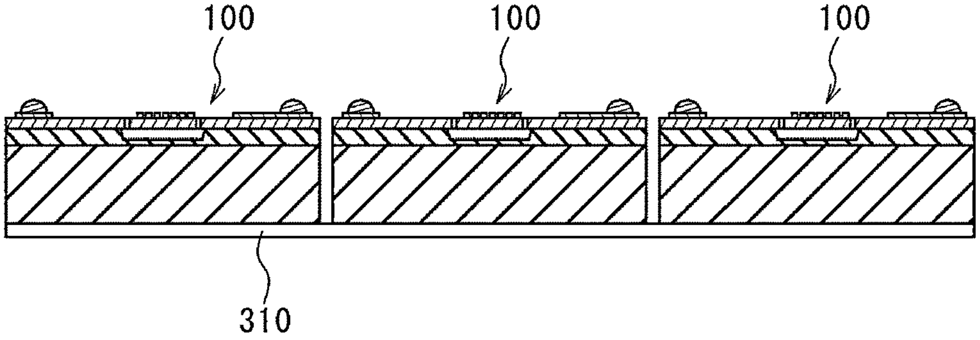
FIG. 19 is a diagram for explaining the method for manufacturing the acoustic wave device in FIG. 13.

In step S4, as illustrated in FIG. 19, the wafer 300 is diced to singulate a plurality of the acoustic wave devices 100 from the wafer 300. The dicing may be performed by blade dicing or laser dicing. The dicing tape 310 may be irradiated with ultraviolet rays after the dicing of the wafer 300 to reduce the adhesion of the dicing tape 310, thus facilitating peeling of the acoustic wave device 100 from the dicing tape 310.

Figure 20:
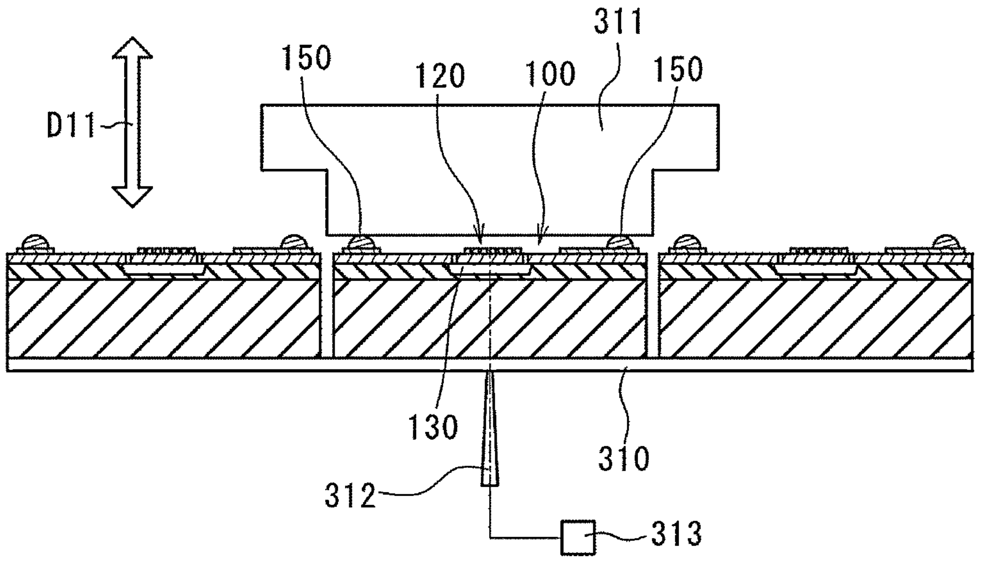
FIG. 20 is a diagram for explaining the method for manufacturing the acoustic wave device in FIG. 13.
Figure 21:
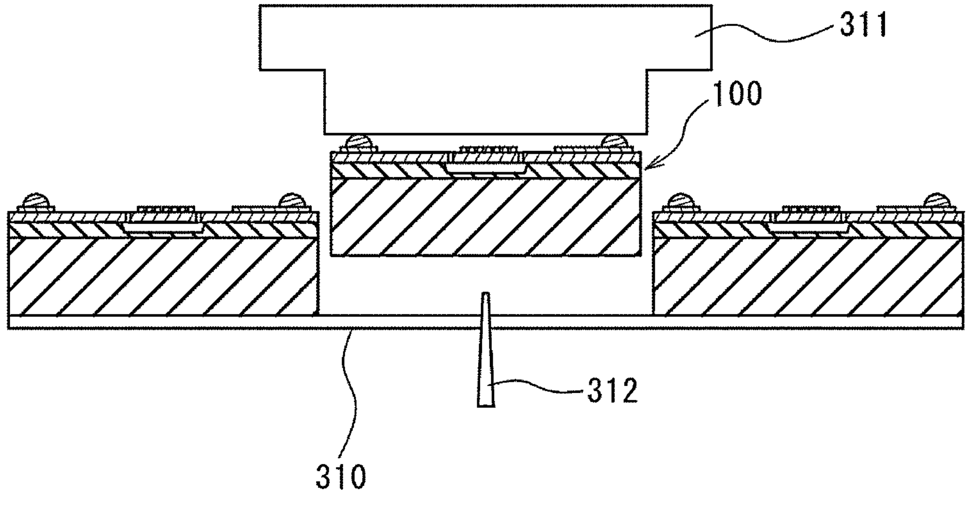
FIG. 21 is a diagram for explaining the method for manufacturing the acoustic wave device in FIG. 13.

In step S5, as illustrated in FIG. 20 and FIG. 21, the singulated acoustic wave device 100 is peeled off from the dicing tape 310 by a pickup nozzle 311 and the abutting pin 312, and is picked up by the pickup nozzle 311. As the pickup nozzle 311, a known pickup nozzle can be used. The abutting pin 312 is an example of a pin. The abutting pin 312 is mechanically connected to a driving device 313, and is movable in the first direction D11 by the driving device 313.

As illustrated in FIG. 20, the pickup nozzle 311 moves in the first direction D11 from an element surface side (upper side in FIG. 20) of the acoustic wave device 100 toward the acoustic wave device 100, and the pickup nozzle 311 comes into contact with the bump 150 of the acoustic wave device 100. One abutting pin 312 moves in the first direction D11 toward the acoustic wave device 100 from a side opposite to the element surface of the acoustic wave device 100 (lower side in FIG. 20) and abuts against the acoustic wave device 100 with the dicing tape 310 interposed therebetween, thus pressing the acoustic wave device 100 toward the pickup nozzle 311. The acoustic wave device 100 is separated from the dicing tape 310 by the abutting pin 312 pressing the acoustic wave device 100 with the dicing tape 310 interposed therebetween. The abutting of the acoustic wave device 100 by the abutting pin 312 and the contact between the pickup nozzle 311 and the bump 150 of the acoustic wave device 100 are performed simultaneously. Thereafter, the pickup nozzle 311 is attracted to the bump 150 of the acoustic wave device 100, and thus the pickup nozzle 311 and the acoustic wave device 100 are fixed to each other. The attraction of the bump 150 of the acoustic wave device 100 by the pickup nozzle 311 and the contact between the bump 150 of the acoustic wave device 100 and the pickup nozzle 311 may be performed simultaneously.

A position at which one abutting pin 312 is abutted against the acoustic wave device 100 is located at the center of the support substrate 102 in plan view in the first direction D11. The hollow portion 130 and the functional electrode are disposed on an extension line of the one abutting pin 312.

Next, as illustrated in FIG. 21, the pickup nozzle 311 moves away from the dicing tape 310, and the pickup nozzle 311 picks up the acoustic wave device 100.

Figure 22:
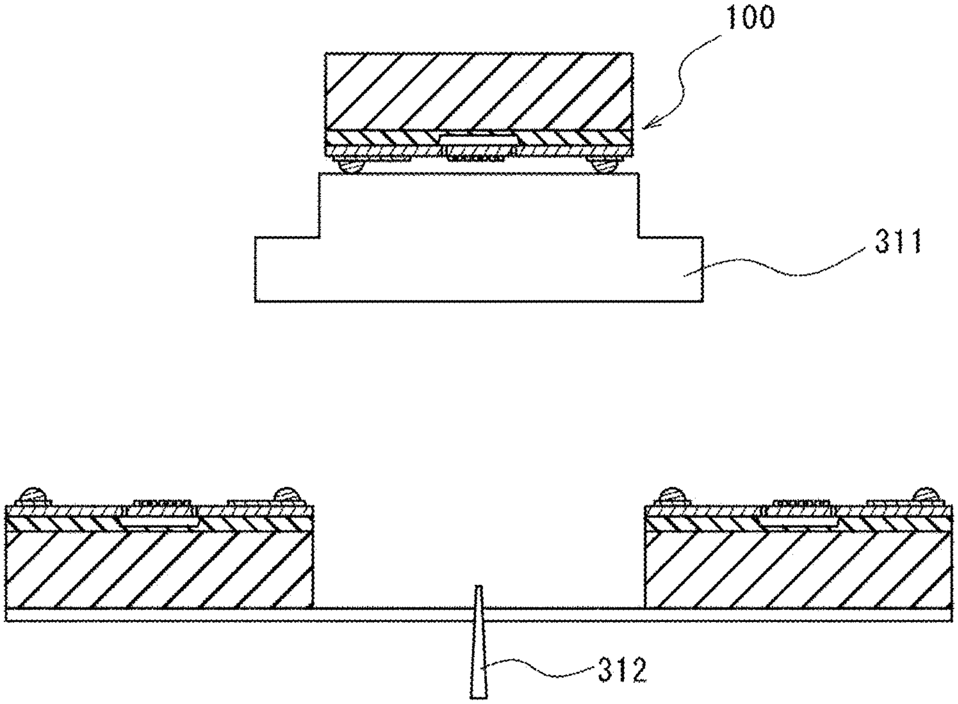
FIG. 22 is a diagram for explaining the method for manufacturing the acoustic wave device in FIG. 13.

In step S6, as illustrated in FIG. 22, the pickup nozzle 311 is reversed (flipped), to reverse the acoustic wave device 100.

Figure 23:
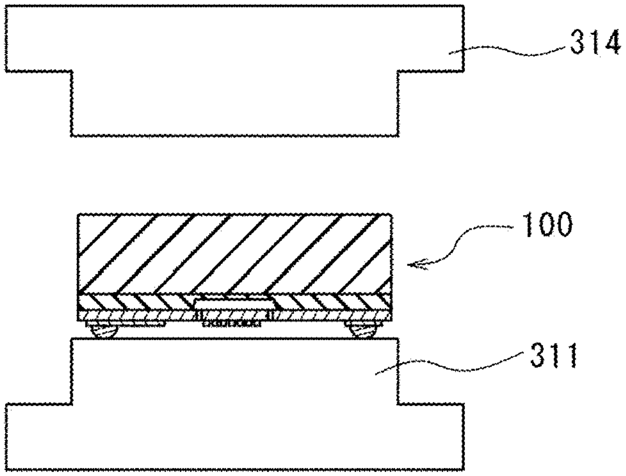
FIG. 23 is a diagram for explaining the method for manufacturing the acoustic wave device in FIG. 13.

In step S7, as illustrated in FIG. 23, the acoustic wave device 100 is delivered from the pickup nozzle 311 to a mounting tool 314. The mounting tool 314 is fixed to the acoustic wave device 100 by being attracted to the side of the acoustic wave device 100 opposite to the element surface, that is, a side of the support 101.

Figure 24:
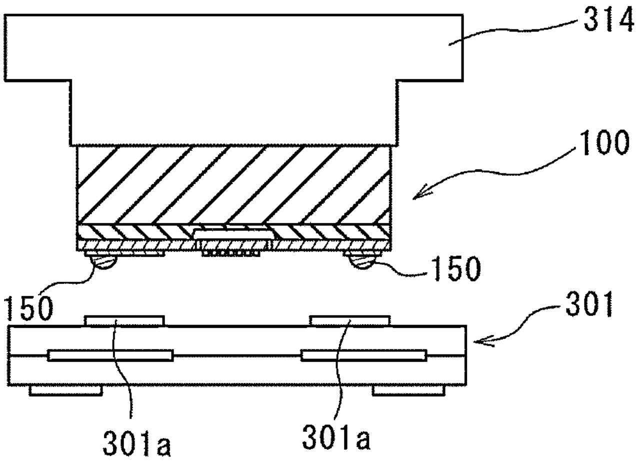
FIG. 24 is a diagram for explaining the method for manufacturing the acoustic wave device in FIG. 13.

Finally, in step S8, as illustrated in FIG. 24, the mounting tool 314 mounts the acoustic wave device 100 on the mounting substrate 301. To be more specific, the bump 150 of the acoustic wave device 100 is bonded to a wiring line 301*a* of the mounting substrate 301, and the acoustic wave device 100 is mounted on the mounting substrate 301.

According to the method for manufacturing the acoustic wave device 100 of the present example embodiment, preparing the wafer 300, attaching the wafer 300 to the dicing tape 310, dicing the wafer 300 to singulate the acoustic wave device 100, abutting at least one abutting pin 312 against the acoustic wave device 100 with the dicing tape 310 interposed therebetween, to separate the acoustic wave device 100 from the dicing tape 310 and pick up the acoustic wave device 100 are included. A position at which the one abutting pin 312 is abutted against the acoustic wave device 100 is located at a position overlapping the hollow portion 130 in the first direction D11. In other words, the position at which the one abutting pin 312 is abutted against the acoustic wave device 100 is located at the position overlapping the hollow portion 130 in plan view in the first direction D11.

According to the above-described method for manufacturing, an occurrence of a crack can be reduced or prevented. If a position at which the abutting pin 312 is abutted against the acoustic wave device 100 is located at a position different from the hollow portion 130 in plan view in the first direction D11, a force due to the abutting pin 312 acts on the piezoelectric layer 110 with the support 101 interposed therebetween, and a crack may occur in the piezoelectric layer 110. In contrast, in the above-described method for manufacturing, a position at which the abutting pin 312 is abutted against the acoustic wave device 100 is located at a position overlapping the hollow portion 130 in plan view in the first direction D11, therefore, the force due to the abutting pin 312 is reduced by the hollow portion 130, and it is possible to reduce or prevent the action of the force on the piezoelectric layer 110. As a result, the occurrence of a crack can be reduced or prevented.

The position at which the one abutting pin 312 is abutted against the acoustic wave device 100 is located at the center C of the acoustic wave device 100 in the first direction D11. In other words, the position at which the one abutting pin 312 is abutted against the acoustic wave device 100 is located at the center C of the acoustic wave device 100 in plan view in the first direction D11. According to the above-described method for manufacturing, it is possible to prevent the acoustic wave device 100 from being inclined when the acoustic wave device 100 is pushed up by the abutting pin 312. As a result, the pickup of the acoustic wave device 100 by the pickup nozzle 311 can be reliably performed.

In the present example embodiment, an example in which a first through hole 112A and a second through hole 112B are respectively provided at both the outer side portions of the resonators 120 has been described, but the present invention is not limited thereto. For example, one or more through holes 112 may be provided at least at any one of the outer side portions of the resonator 120.

In the present example embodiment, an example in which the hollow portion 130 is provided at a position overlapping the first busbar 121 and the second busbar 122 in plan view in the first direction D11 has been described, but the present invention is not limited thereto. For example, the hollow portion 130 may be provided at a position overlapping neither the first busbar 121 nor the second busbar 122 in plan view in the first direction D11.

The through hole 112 may also be used as an etching hole to introduce an etchant, for example.

In the present example embodiment, an example in which the IDT electrode is provided on the piezoelectric layer 110 has been described, but the present invention is not limited thereto. It is sufficient for the IDT electrode to be provided to the piezoelectric layer 110 in the first direction D11. For example, the IDT electrode may be provided on a side of the piezoelectric layer 110 where the hollow portion 130 is provided.

Hereinafter, a modification of the second example embodiment will be described.

Modification 1

Figure 25:
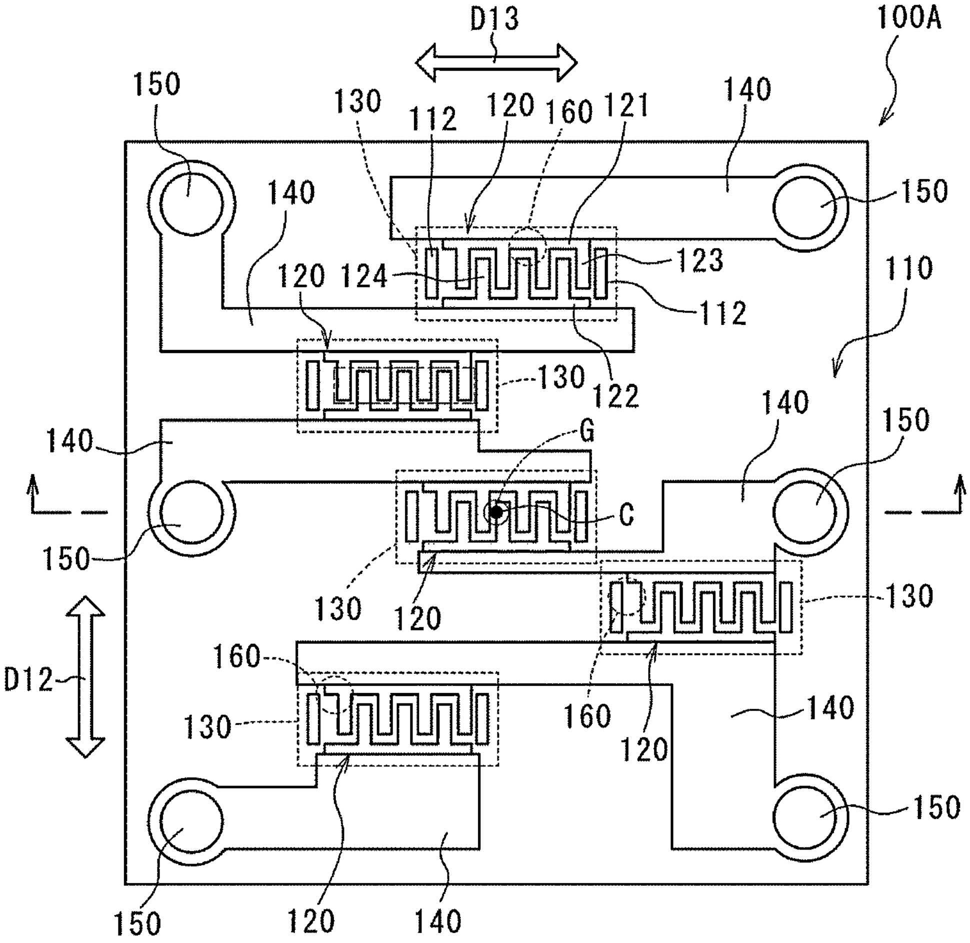
FIG. 25 is a schematic plan view of an acoustic wave device according to a modification of the second example embodiment of the present invention.

FIG. 25 is a schematic plan view of an acoustic wave device according to Modification 1 of the second example embodiment of the present invention. As illustrated in FIG.

25, an acoustic wave device 100A is different from the acoustic wave device 100 of the second example embodiment in that a plurality of the abutting marks 160 is provided.

In the acoustic wave device 100A, the plurality of abutting marks 160 are located at positions each overlapping the hollow portion 130 in plan view in the first direction D11. A center of gravity G of the plurality of abutting marks 160 overlaps the center C of the acoustic wave device 100A in plan view in the first direction D11. Here, the "center of gravity G of the plurality of abutting marks 160" may be, for example, a geometric center of the plurality of abutting marks 160 in plan view in the first direction D11.

In an example of a method for manufacturing the acoustic wave device 100A of Modification 1, the pickup nozzle 311 and the plurality of abutting pins 312 are used to peel off and pick up the singulated acoustic wave device 100 from the dicing tape 310. A center of gravity of a plurality of positions at which the plurality of abutting pins 312 are abutted against the acoustic wave device 100A is located at the center C of the acoustic wave device 100A in plan view in the first direction D11. Here, the "center of gravity of the plurality of positions" may be, for example, a geometric center of the plurality of abutting positions in plan view in the first direction D11.

Such a method for manufacturing can also reduce or prevent an occurrence of a crack.

The center of gravity of the plurality of positions at which the plurality of abutting pins 312 are abutted against the acoustic wave device 100A is located at the center C of the acoustic wave device 100 in the first direction D11. In other words, the center of gravity of the plurality of positions at which the plurality of abutting pins 312 are abutted against the acoustic wave device 100A is located at the center C of the acoustic wave device 100A in plan view in the first direction D11. With such a method for manufacturing, it is possible to prevent the acoustic wave device 100A from being inclined when the acoustic wave device 100A is pushed up by the abutting pins 312. As a result, the pickup nozzle 311 can reliably pick up the acoustic wave device 100A.

As described above, example embodiments of the present invention have been described as examples of the technique disclosed in the present application. However, the technique in the present disclosure is not limited thereto, and is also applicable to example embodiments in which changes, replacement, addition, omission, and the like are made as appropriate.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A method for manufacturing an acoustic wave element including a support, a piezoelectric material layer on the support, and a functional electrode on the piezoelectric material layer, the support including a hollow portion at a position overlapping a portion of the functional electrode in a lamination direction of the support and the piezoelectric material layer, the method comprising:

preparing a wafer;

attaching the wafer to a dicing tape;

dicing the wafer to singulate the acoustic wave element; and abutting plurality of pins against the acoustic wave element with the dicing tape interposed therebetween, to separate the acoustic wave element from the dicing tape and pick up the acoustic wave element; wherein a position at which the at least one pin is abutted against the acoustic wave element overlaps the hollow portion in the lamination direction; and a center of gravity of a plurality of positions at which the plurality of pins are abutted against the acoustic wave element is located at a center of the acoustic wave element in the lamination direction.

2. The method for manufacturing according to claim 1, wherein the support includes:

a support substrate including a principal surface facing the piezoelectric material layer; and a bonding layer on the principal surface of the support substrate; and the hollow portion is provided in the bonding layer at a position overlapping a portion of the functional electrode in plan view as viewed in the lamination direction.

3. The method for manufacturing according to claim 1, wherein the piezoelectric material layer includes lithium niobate or lithium tantalate.

4. The method for manufacturing according to claim 1, wherein the functional electrode is an interdigital transducer (IDT) electrode.

5. The method for manufacturing according to claim 4, wherein the IDT electrode includes a plurality of first electrode fingers extending in a first direction intersecting the lamination direction, and a plurality of second electrode fingers facing respective ones of the plurality of first electrode fingers in a second direction orthogonal or substantially orthogonal to the first direction, and extending in the first direction; and d/p is about 0.5 or less, when d is a film thickness of the piezoelectric material layer, and p is a center-to-center distance between the first electrode finger and the second electrode finger.

6. The method for manufacturing according to claim 4, wherein the IDT electrode includes a plurality of first electrode fingers extending in a first direction intersecting the lamination direction, and a plurality of second electrode fingers facing respective ones of the plurality of first electrode fingers in a second direction orthogonal or substantially orthogonal to the first direction, and extending in the first direction; and in a case where d is a film thickness of the piezoelectric material layer, and p is a center-to-center distance between adjacent electrode fingers of the plurality of first electrode fingers and the plurality of second electrode fingers;

MR satisfies $MR \leq$ about $1.75\times(d/p)+0.075$, when MR is a metallization ratio being a ratio of a total area of an area of the plurality of first electrode fingers and an area of the plurality of second electrode fingers in an excitation region to an area of the excitation region where the plurality of first electrode fingers and the plurality of second electrode fingers overlap each other.

7. The method for manufacturing according to claim 3, wherein

Euler angles ($\phi$, $\theta$, $\psi$) of the lithium niobate or the lithium tantalate are in a range of Formula (1), (2), or (3):

$$(0° \pm 10°, 0° \text{ to } 20°, \text{any } \psi); \quad \text{Formula (1)}$$

$$(0° \pm 10°, 20° \text{ to } 80°, 0° \text{ to } 60°(1-(\theta-50)^2/900)^{1/2}) \text{ or} \quad \text{Formula (2)}$$

$$(0° \pm 10°, 20° \text{ to } 80°, [180° - 60°(1-(\theta-50)^2/900)^{1/2}] \text{ to } 180°);$$

$$(0° \pm 10°, [180° - 30°(1-(\psi-90)^2/8100)^{1/2}] \text{ to } 180°, \text{any } \psi). \quad \text{Formula (3)}$$

8. A method for manufacturing an acoustic wave element including a support, a piezoelectric material layer on the support, and a functional electrode on the piezoelectric material layer, the support including a hollow portion at a position overlapping a portion of the functional electrode in a lamination direction of the support and the piezoelectric material layer, the method comprising:

preparing a wafer;

attaching the wafer to a dicing tape;

dicing the wafer to singulate the acoustic wave element; and abutting a pin against the acoustic wave element with the dicing tape interposed therebetween, to separate the acoustic wave element from the dicing tape and pick up the acoustic wave element; wherein the pin includes only one pin;

a position at which the pin is abutted against the acoustic wave element overlaps the hollow portion in the lamination direction; and a position at which the pin is abutted against the acoustic wave element is located at a center of the acoustic wave element in the lamination direction.

9. An acoustic wave element, comprising:

a support;

a piezoelectric material layer on the support; and a functional electrode on the piezoelectric material layer; wherein the support includes a hollow portion at a position overlapping at least a portion of the functional electrode in a lamination direction of the support and the piezoelectric material layer;

a surface of the support facing the piezoelectric material layer includes at least one abutting mark defined by a contact mark including a pin; and the at least one abutting mark is located at a position overlapping the hollow portion in the lamination direction.

10. The acoustic wave element according to claim 9, wherein the at least one abutting mark includes a plurality of abutting marks; and a center of gravity of the plurality of abutting marks is located at a center of the support in the lamination direction.

11. The acoustic wave element according to claim 9, wherein the at least one abutting mark includes only one abutting mark; and the abutting mark is located at a center of the acoustic wave element in the lamination direction.

12. The acoustic wave element according to claim 9, wherein the support includes:

a support substrate including a principal surface facing the piezoelectric material layer; and a bonding layer on the principal surface of the support substrate; and the hollow portion is provided in the bonding layer at a position overlapping a portion of the functional electrode in plan view as viewed in the lamination direction.

13. The acoustic wave element according to claim 9, wherein the piezoelectric material layer includes lithium niobate or lithium tantalate.

14. The acoustic wave element according to claim 9, wherein the functional electrode is an interdigital transducer (IDT) electrode.

15. The acoustic wave element according to claim 14, wherein the IDT electrode includes a plurality of first electrode fingers extending in a first direction intersecting the lamination direction, and a plurality of second electrode fingers facing respective ones of the plurality of first electrode fingers in a second direction orthogonal or substantially orthogonal to the first direction, and extending in the first direction; and d/p is about 0.5 or less, when d is a film thickness of the piezoelectric material layer, and p is a center-to-center distance between the first electrode finger and the second electrode finger.

16. The acoustic wave element according to claim 14, wherein the IDT electrode includes a plurality of first electrode fingers extending in a first direction intersecting the lamination direction, and a plurality of second electrode fingers facing respective ones of the plurality of first electrode fingers in a second direction orthogonal or substantially orthogonal to the first direction, and extending in the first direction; and in a case where d is a film thickness of the piezoelectric material layer, and p is a center-to-center distance between adjacent electrode fingers of the plurality of first electrode fingers and the plurality of second electrode fingers;

MR satisfies MR≤about 1.75×(d/p)+0.075, when MR is a metallization ratio being a ratio of a total area of an area of the plurality of first electrode fingers and an area of the plurality of second electrode fingers in an excitation region to an area of the excitation region where the plurality of first electrode fingers and the plurality of second electrode fingers overlap each other.

17. The acoustic wave element according to claim 13, wherein

Euler angles (ϕ, θ, ψ) of the lithium niobate or the lithium tantalate are in a range of Formula (1), (2), or (3):

$$(0° \pm 10°, 0° \text{ to } 20°, \text{any } \psi); \quad \text{Formula (1)}$$

$$(0° \pm 10°, 20° \text{ to } 80°, 0° \text{ to } 60°(1-(\theta-50)^2/900)^{1/2}) \text{ or} \quad \text{Formula (2)}$$

$$(0° \pm 10°, 20° \text{ to } 80°, [180° - 60°(1-(\theta-50)^2/900)^{1/2}] \text{ to } 180°);$$

$$(0° \pm 10°, [180° - 30°(1-(\psi-90)^2/8100)^{1/2}] \text{ to } 180°, \text{any } \psi). \quad \text{Formula (3)}$$

* * * * *